(12) United States Patent
Johnson et al.

(10) Patent No.: US 9,025,135 B2
(45) Date of Patent: May 5, 2015

(54) SHARED COMPLIANCE IN A RAPID EXCHANGE DEVICE FOR RETICLES, AND RETICLE STAGE

(75) Inventors: Richard John Johnson, Danbury, CT (US); Frits Van Der Meulen, Eindhoven (NL); Eric Bernard Westphal, Monroe, CT (US); Jeremy Rex Heaston, Upper Saddle River, NJ (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 625 days.

(21) Appl. No.: 13/260,017

(22) PCT Filed: Feb. 24, 2010

(86) PCT No.: PCT/EP2010/052340
§ 371 (c)(1),
(2), (4) Date: Dec. 23, 2011

(87) PCT Pub. No.: WO2010/115657
PCT Pub. Date: Oct. 14, 2010

(65) Prior Publication Data
US 2012/0092640 A1    Apr. 19, 2012

Related U.S. Application Data

(60) Provisional application No. 61/166,951, filed on Apr. 6, 2009.

(51) Int. Cl.
*G03F 7/20* (2006.01)
*H01L 21/677* (2006.01)
*H01L 21/67* (2006.01)

(52) U.S. Cl.
CPC ........ *G03F 7/70916* (2013.01); *G03F 7/70725* (2013.01); *H01L 21/67745* (2013.01);
(Continued)

(58) Field of Classification Search
CPC ... G03F 1/0092; G03F 7/70691; G03F 7/707; G03F 7/70708; G03F 7/70716; G03F 7/70725; G03F 7/70733; G03F 7/70741; G03F 7/70775; H01L 21/67; H01L 21/677; H01L 21/67703; H01L 21/67706; H01L 21/67739; H01L 21/67742; H01L 21/67751; H01L 21/67796; H01L 21/687
USPC ...................... 279/3, 128; 355/72, 73, 75–77; 361/234; 414/935–941; 901/30, 45
See application file for complete search history.

(56) References Cited

U.S. PATENT DOCUMENTS 4,617,681 A    10/1986  LaFiandra et al.
5,130,747 A     7/1992  Kikuiri et al.
(Continued)

OTHER PUBLICATIONS

International Search Report directed to related International Patent Application No. PCT/EP2010/052340, mailed May 7, 2010, from the European Patent Office; 3 pages.
(Continued)

*Primary Examiner* — Colin Kreutzer
(74) *Attorney, Agent, or Firm* — Sterne, Kessler, Goldstein & Fox P.L.L.C.

(57) ABSTRACT

Provided is a method to load a patterning device (1010) onto a reticle stage (RS) of a lithography system, a Rapid Exchange Device (RED) configured to load a patterning device (1010) onto a reticle stage (RS) of a lithography system, and a system for manufacturing a semiconductor device lithographically. The method involves sharing compliance among six degree of freedom between the reticle stage (RS) and the RED. The RED complies in only a first three degrees of freedom and the reticle stage (RS) in only a second three degrees of freedom until the reticle stage (RS) and patterning device (1010) are substantially in contact and coplanar.

19 Claims, 22 Drawing Sheets

(52) U.S. Cl.
CPC ........... *H01L21/67739* (2013.01); *H01L 21/67* (2013.01); *G03F 7/70691* (2013.01); *G03F 7/707* (2013.01); *G03F 7/70733* (2013.01); *G03F 7/70741* (2013.01); *Y10S 901/45* (2013.01)

(56) References Cited

U.S. PATENT DOCUMENTS

| | | | |
|---|---|---|---|
| 5,464,715 A * | 11/1995 | Nishi et al. | 430/22 |
| 6,414,744 B1 * | 7/2002 | Kuiper et al. | 355/75 |
| 7,167,233 B2 | 1/2007 | Van De Ven | |
| 7,428,958 B2 | 9/2008 | Tanaka | |
| 2003/0162101 A1 | 8/2003 | Heerens et al. | |
| 2004/0019408 A1 | 1/2004 | del Puerto et al. | |
| 2004/0246459 A1 | 12/2004 | Tinnemans et al. | |
| 2005/0168718 A1 * | 8/2005 | Lenox | 355/75 |
| 2008/0246939 A1 | 10/2008 | Yonekawa et al. | |

OTHER PUBLICATIONS

International Preliminary Report on Patentability with the Written Opinion of the International Searching Authority directed to related International Patent Application No. PCT/EP2010/052340, mailed Oct. 20, 2011, from the International Bureau of WIPO; 11 pages.

* cited by examiner

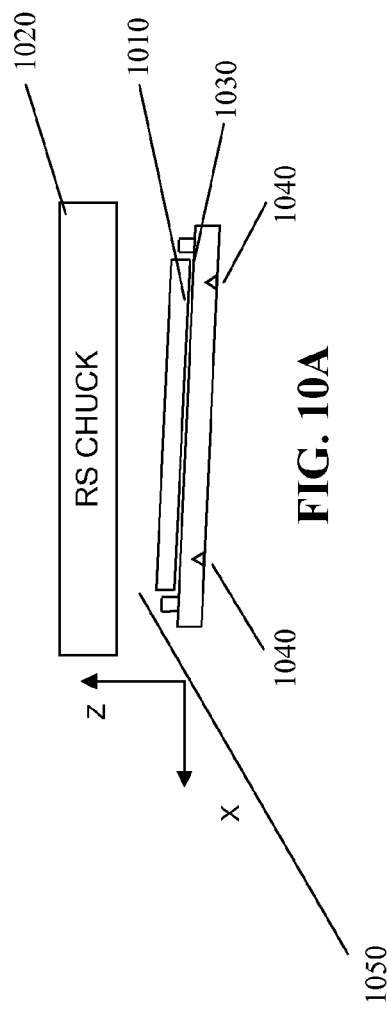
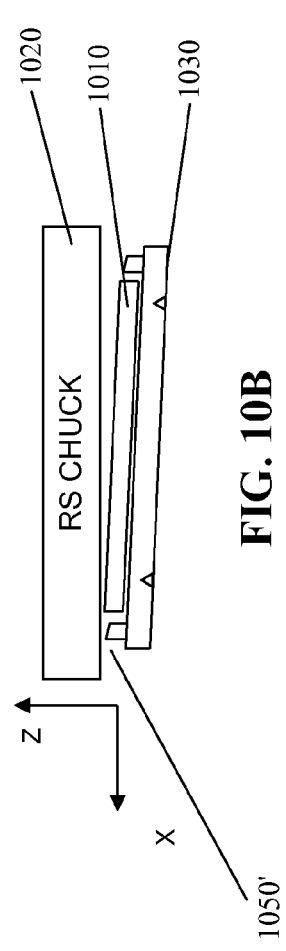
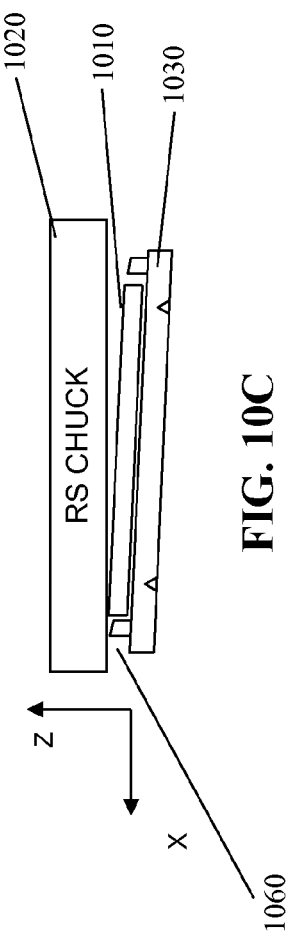
FIG. 10A
FIG. 10B
FIG. 10C

SHARED COMPLIANCE IN A RAPID EXCHANGE DEVICE FOR RETICLES, AND RETICLE STAGE

BACKGROUND OF THE INVENTION

1. Field of the Invention

The present invention relates to a method to load a patterning device onto a reticle stage of a lithography system, a rapid exchange device (RED) configured to load a patterning device onto a reticle stage of a lithography system, and a system for manufacturing a semiconductor device lithographically.

2. Related Art

Lithography is widely recognized as a key processes in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device, which is alternatively referred to as a mask or a reticle, generates a circuit pattern to be formed on an individual layer in an IC. This pattern may be transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned. Manufacturing different layers of the IC often requires imaging different patterns on different layers with different reticles. Therefore, reticles must be changed during the lithographic process.

The market demands that the lithographic apparatus perform the lithography process as quickly as possible to maximize manufacturing capacity and keep costs per device low. Thus, it is preferable that changing reticles during the lithography process takes the least possible time. Extreme ultraviolet (EUV) lithography requires a vacuum environment. Unfortunately, conventional reticle exchange devices are not designed to function in a vacuum environment, and those that are designed to function in a vacuum environment are not fast enough. Conventional reticle exchange devices also may cause particle generation when they transfer the reticle to the reticle stage of the lithographic apparatus because of relative movement between the exchange device holding the reticle and the reticle stage. Particulate contamination causes manufacturing defects which waste production capacity, time, and materials. This waste reduces foundry efficiency and increases fabrication expenses.

BRIEF SUMMARY OF THE INVENTION

In one embodiment of the present invention, a method to load a patterning device onto a reticle stage of a lithography system is presented. The method includes positioning a Rapid Exchange Device (RED) into close proximity to the reticle stage, the RED having the patterning device positioned thereon; moving the reticle stage to initiate contact with the patterning device; and controlling the patterning device to be compliant in only a first three degrees of freedom and the reticle stage to be compliant in only a second three degrees of freedom until the reticle stage and patterning device are substantially in contact and coplanar. The first and second three degrees of freedom are different.

In another embodiment of the present invention, a Rapid Exchange Device (RED) configured to load a patterning device onto a reticle stage of a lithography system is presented. The RED includes a gripper and a kinematic mount comprising compliant pins attached to the gripper to position a patterning device on the gripper. The kinematic mount allows the patterning device to move in only three degrees of freedom.

The present invention also relates to a system for manufacturing a semiconductor device lithographically. The system includes a reticle stage and a Rapid Exchange Device (RED) to load a patterning device onto the reticle stage. The RED includes a gripper and a kinematic mount attached to the gripper to position a patterning device on the gripper. The kinematic mount allows the patterning device to move in only a first three compliant degrees of freedom.

Further embodiments, features, and advantages of the present invention, as well as the structure and operation of the various embodiments of the present invention, are described in detail below with reference to the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 10A-10E schematically show steps in a sequence consistent with one embodiment of the present invention to load a patterning device onto a reticle stage of a lithography system according to one embodiment of the present invention.

Figure 1:
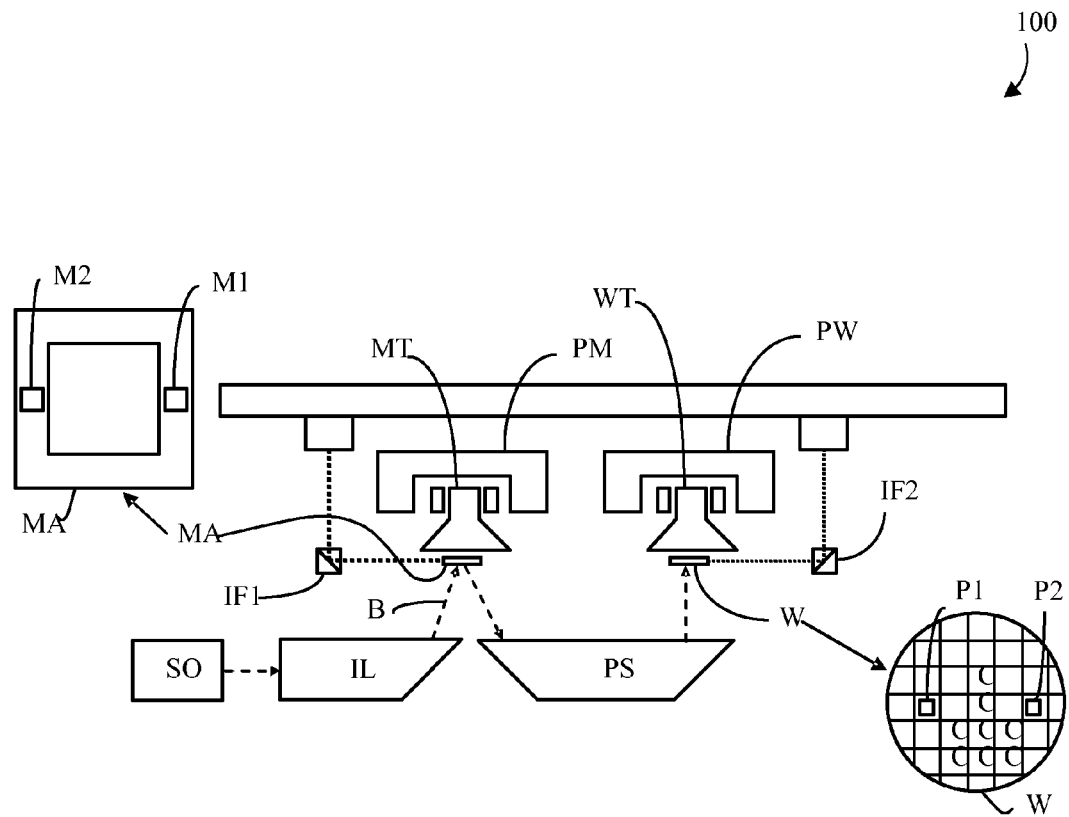
FIG. 1 depicts a lithographic apparatus, according to one embodiment of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts a lithographic apparatus 100 according to one embodiment of the invention. The lithographic apparatus 100 comprises an illumination system (illuminator) IL configured to condition a radiation beam B (e.g., EUV radiation); a support structure (e.g., a mask table) MT configured to support a patterning device (e.g., a mask or a reticle) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. The lithographic apparatus 100 also has a projection system (e.g., a reflective projection lens system) PS configured to project a pattern imparted to the radiation beam B by patterning device MA onto a target portion (e.g., comprising one or more dies) C of the substrate W.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatus 100, and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive or reflective. Examples of patterning devices MA include reticles, masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

As here depicted, the lithographic apparatus 100 is of a reflective type (e.g., employing a reflective mask). Alternatively, the lithographic apparatus 100 may be of a transmissive type (e.g., employing a transmissive mask).

The lithographic apparatus 100 may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIG. 1, the illuminator IL receives a radiation beam from a radiation source SO. The source SO and the lithographic apparatus 100 may be separate entities, for example when the source SO is an excimer laser. In such cases, the source SO is not considered to form part of the lithographic apparatus 100, and the radiation beam B passes from the source SO to the illuminator IL with the aid of a beam delivery system BD (not shown) comprising, for example, suitable directing mirrors and/or a beam expander. In other cases the source SO may be an integral part of the lithographic apparatus 100, for example when the source SO is a mercury lamp. The source SO and the illuminator IL, together with the beam delivery system BD if required, may be referred to as a radiation system.

The illuminator IL may comprise an adjuster AD (not shown) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components not shown, such as an integrator and a condenser. The illuminator IL may be used to condition the radiation beam B, to have a desired uniformity and intensity distribution in its cross section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The depicted lithographic apparatus 100 may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g. mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

In an embodiment of the invention, there is provided a method for exchanging reticles MA in a vacuum environment of the lithography tool 100, such as an Extreme Ultraviolet (EUV) lithography tool, that uses a rotational Rapid Exchange Device (RED) to minimize reticle exchange time, particle generation, and outgassing. The method calls for handling a baseplate holding the reticle MA instead of gripping the reticle MA directly with the RED during exchange of the reticle MA. To minimize the reticle exchange time, the RED has at least two robotic grippers that each hold a respective baseplate. Each baseplate may hold a respective reticle MA. By using the multiple robotic grippers, loading of a first reticle to the RED, prealignment of a second reticle (if required), transfer of a third reticle to a reticle stage, and buffering of a baseplate for the third reticle may be performed substantially concurrently. By using multiple grippers, the time for storing a reticle, retrieving a second reticle, and transferring the second reticle to a reticle stage is reduced because at least a part of loading and unloading of multiple reticles at various positions is performed substantially simultaneously instead of serially. The RED also saves time by moving multiple reticles from one position to another substantially simultaneously instead of serially.

The RED also protects the reticles, as well as unfinished lithography products. The rotational parts of the RED have at least one sealed chamber that holds a motor system, which rotates the RED. The sealed chamber minimizes particulate contamination and outgassing from motor system parts, such as the motor, motor bearings, a position encoder, etc. A scavenging seal, also known as a differential seal or a differentially pumped seal, is used between rotating components and the sealed chamber to maintain a vacuum in the clean vacuum environment outside the RED, while reducing particulate contamination and outgassing from entering the clean vacuum environment. The RED also may have at least one additional sealed chamber that holds a translational mechanism, which translates the RED along the RED's axis of rotation. This second chamber has bellows to separate a vacuum from dirty components in the translational mechanism, such as an actuator, bearings, etc. The RED's bellows reduce particulate contamination and outgassing entering the vacuum.

FIGS. 2A-2E illustrate an embodiment of the invention that has a two-armed rotational rapid exchange device (RED) 200. Following are FIGS. 3A-3D, which show an embodiment of the invention that has a three-armed rotational rapid exchange device (RED) 300. Although two- and three-armed REDs 200, 300 are illustrated, these examples are not limiting. Various embodiments may have two or more arms, and thus simultaneously transport two or more reticles. Also, in various embodiments, a first arm of a RED may be fixed at any angle relative to a second arm of the RED.

Figure 2A:
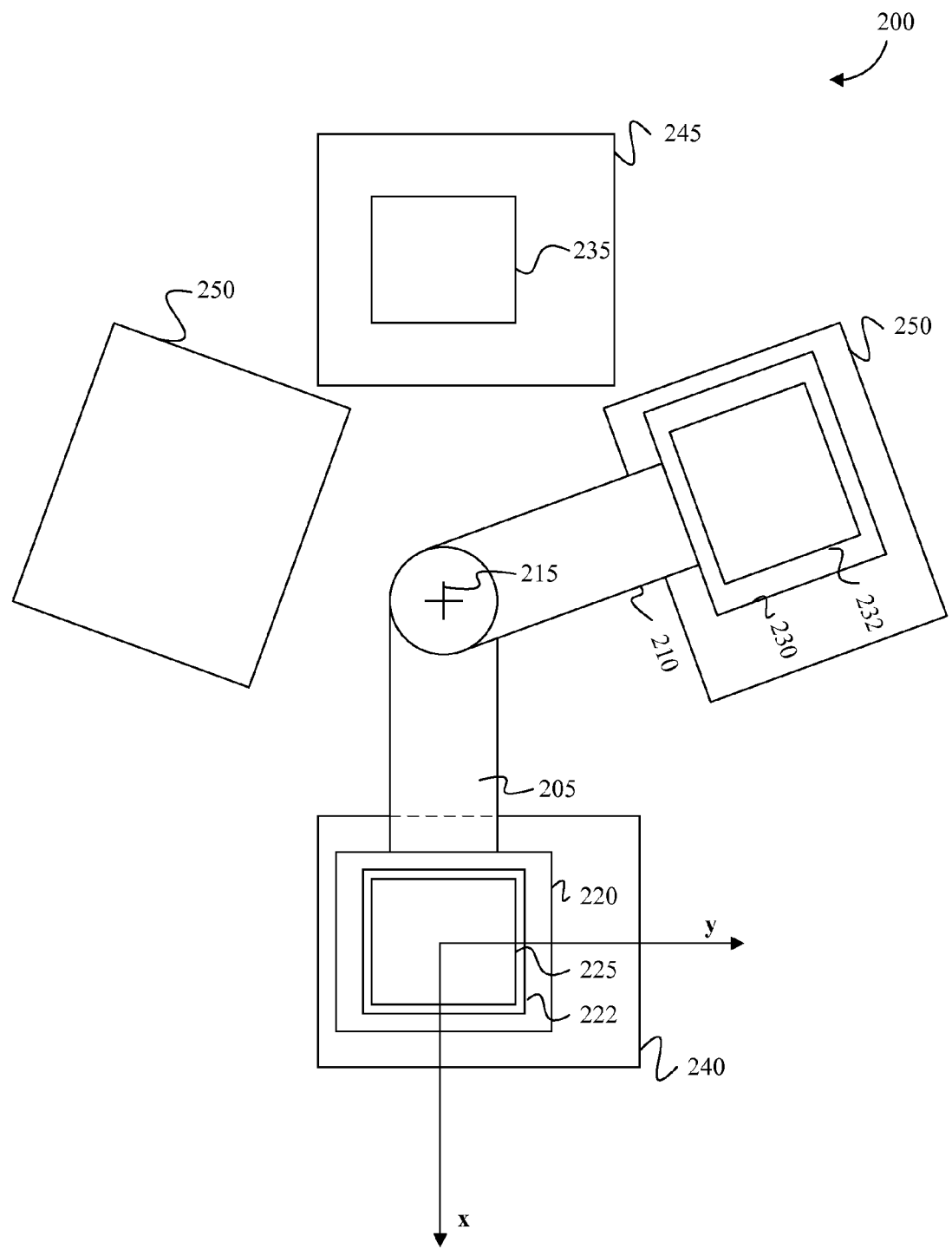
FIG. 2A depicts a top-view of a two-armed rapid exchange device, according to one embodiment of the present invention.

FIG. 2A depicts a top-view of the two-armed rotational rapid exchange device 200. The two-armed RED 200 has a first arm 205 and a second arm 210 that rotate about a central axis 215, which runs into the page. At an end of the first arm 205 is a first robotic gripper 220 that is configured to grip a first baseplate 222, which is configured to hold a first reticle 225. Similarly, at the end of the second arm 210 is a second robotic gripper 230 that is configured to grip a second baseplate 232, which is capable of holding a second reticle 235. Thus, the first arm 205 and the second arm 210 are baseplate supports.

The first and second baseplates 222, 232 and the first and second arms 205, 210 are configured to rotate in unison. In an embodiment, the first and second baseplates 222, 232 are located substantially equidistant from the central axis 215. In an embodiment, the first arm 205 is located at an angle substantially ninety degrees from the second arm 210.

According to an embodiment of the invention, the two-armed RED 200 rotates to three positions. The first position is a reticle loading and unloading position 240. In the reticle loading and unloading position 240, a first baseplate 222 holding the first reticle 225 is transferred between the first robotic gripper 220 and a reticle storage device by a first robotic device (not shown). The second position is a reticle stage loading and unloading position 245. In the reticle stage loading and unloading position 245, the first reticle 225 is transferred between the first baseplate 222 and a reticle stage (not shown), such as the support structure MT in the lithographic apparatus 100 of FIG. 1. The first reticle 225 can be transferred by the RED 200 directly to the reticle stage (not shown). The third position is a baseplate buffering position 250. When the first reticle 225 is located on the reticle stage, the two-armed RED 200 rotates and moves the first robotic gripper 220 and the first baseplate 222 to the baseplate buffering position 250 to keep the two-armed RED 200 from interfering with use of the first reticle 225. It is to be appreciated that in the various positions, the second reticle 235 may be processed and exchanged in a manner similar to that of the first reticle 225. Dynamic operation of the two-armed RED 200 is described in further detail elsewhere herein.

Figure 2B:
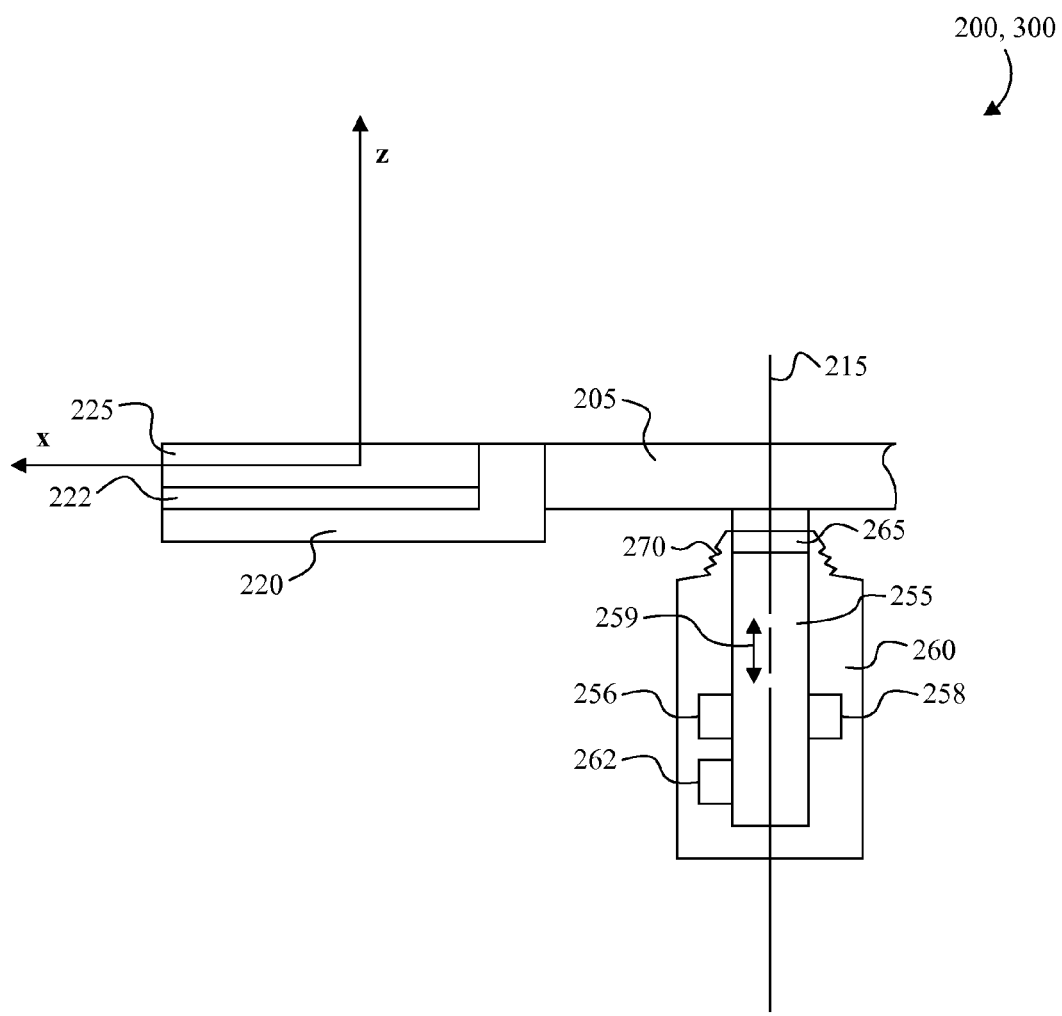
FIG. 2B depicts a side view of a rapid exchange device, according to one embodiment of the present invention.

FIG. 2B depicts a partial side view of the two- and three-armed rotational rapid exchange devices 200, 300, according to embodiments of the invention. For simplicity, only one exemplary arm, the first arm 205, is shown in FIG. 2B. Other arms of the two- and three-armed rotational rapid exchange devices 200, 300 may have a similar arrangement.

FIG. 2B shows that at a distal end of the first arm 205 is found the first robotic gripper 220 holding the first baseplate 222, which in turn holds the first reticle 225. The first arm 205 rotates about the central axis 215 through being coupled to a shaft 255. The shaft 255 is mechanically coupled to a motor system 256, which is configured to rotate the shaft 255. An optional position encoder 258 may be coupled to the shaft 255 to provide positional feedback. In the example illustrated in FIG. 2B, the shaft 255 not only rotates, but also is translatable, as shown by arrow 259, along the axis of rotation 215, so that the RED 200, 300 is translatable along the axis of rotation 215. Translation of the RED 200, 300 permits transfer of baseplates and reticles at different heights along the central axis 215. An actuator 262 is mechanically coupled to the shaft 255 to translate the shaft 255 along the axis of rotation 215.

The motor system 256 and actuator 262 are sealed in a chamber 260, such that outgassing and particle contamination from the motor system is substantially eliminated from the clean vacuum when compared to conventional reticle exchange devices. The chamber 260 is sealed about the shaft 255 with a seal 265, such as a scavenging seal which further eliminates particle generation that would be present with a traditional O-ring seal and outgassing grease that would be required for the tradition O-ring seal. Flexible bellows 270 keep the chamber 260 sealed when the shaft 255 translates along the axis of rotation 215.

Figure 2C:
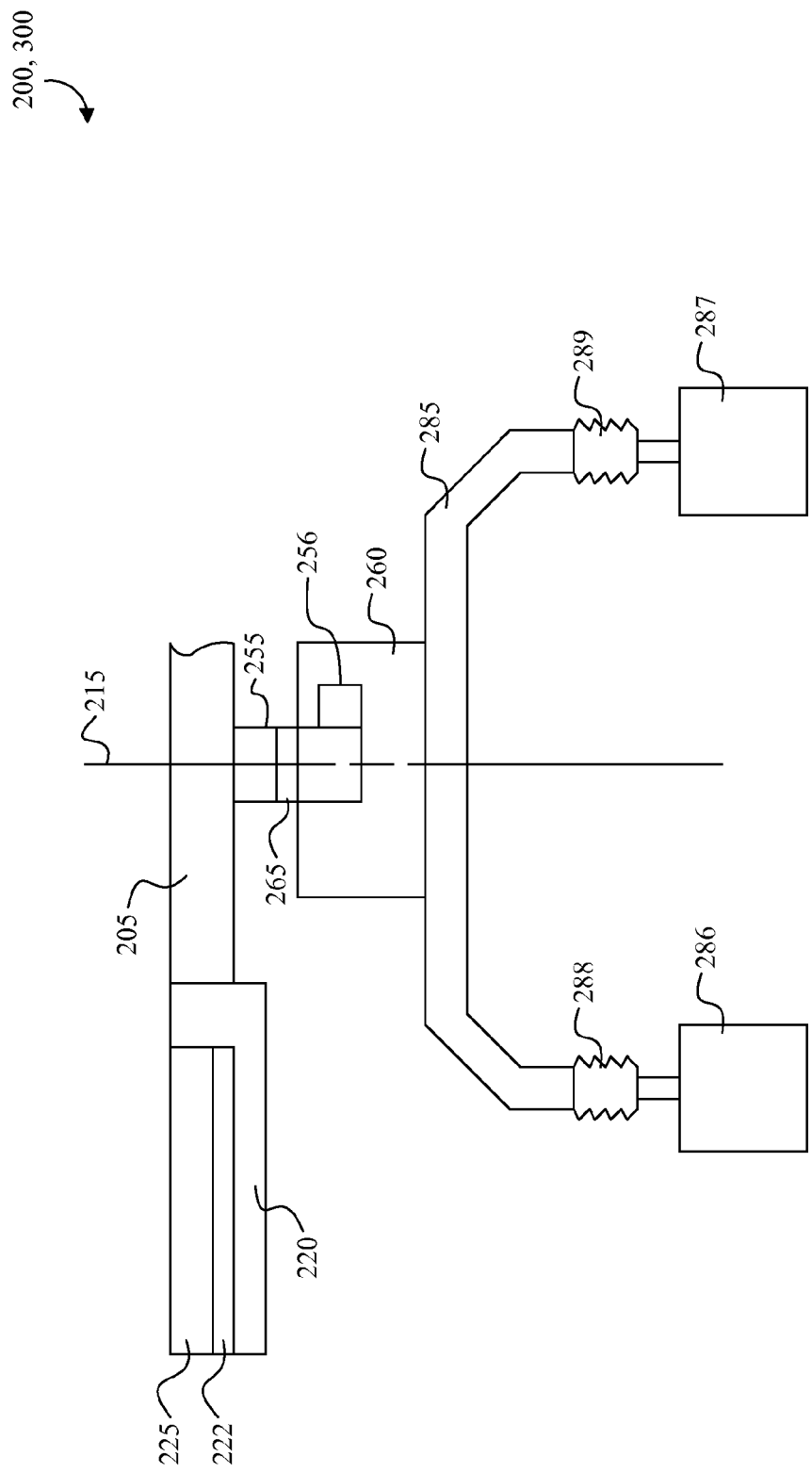
FIG. 2C depicts a side-view of a rapid exchange device having a support, according to one embodiment of the present invention.

FIG. 2C depicts a side view of the two- and three-armed rotational rapid exchange devices 200, 300 that is an alternative arrangement to that shown in FIG. 2B, according to one embodiment of the invention. As in FIG. 2B, for simplicity, only one exemplary arm, the first arm 205, is shown in FIG. 2C. Other arms of the two- and three-armed rotational rapid exchange devices 200, 300 may have a similar arrangement.

The chamber 260 in FIG. 2C contains a motor system 256 to rotate the shaft 255. The chamber 260 is mounted on a support 285, which is coupled to actuators 286, 287, which translate the shaft 255, the chamber 260, and the frame 285 along the axis of rotation 215. The actuators 286, 287 have respective flexible bellows 288, 289 to seal the actuators 286, 287 from the surrounding atmosphere, such as a vacuum, when the shaft 255 translates along the axis of rotation 215. Use of the bellows 288, 289 substantially eliminates outgassing and particle contamination from the actuators 286, 287 when compared to those of conventional reticle exchange devices.

Figure 2D:
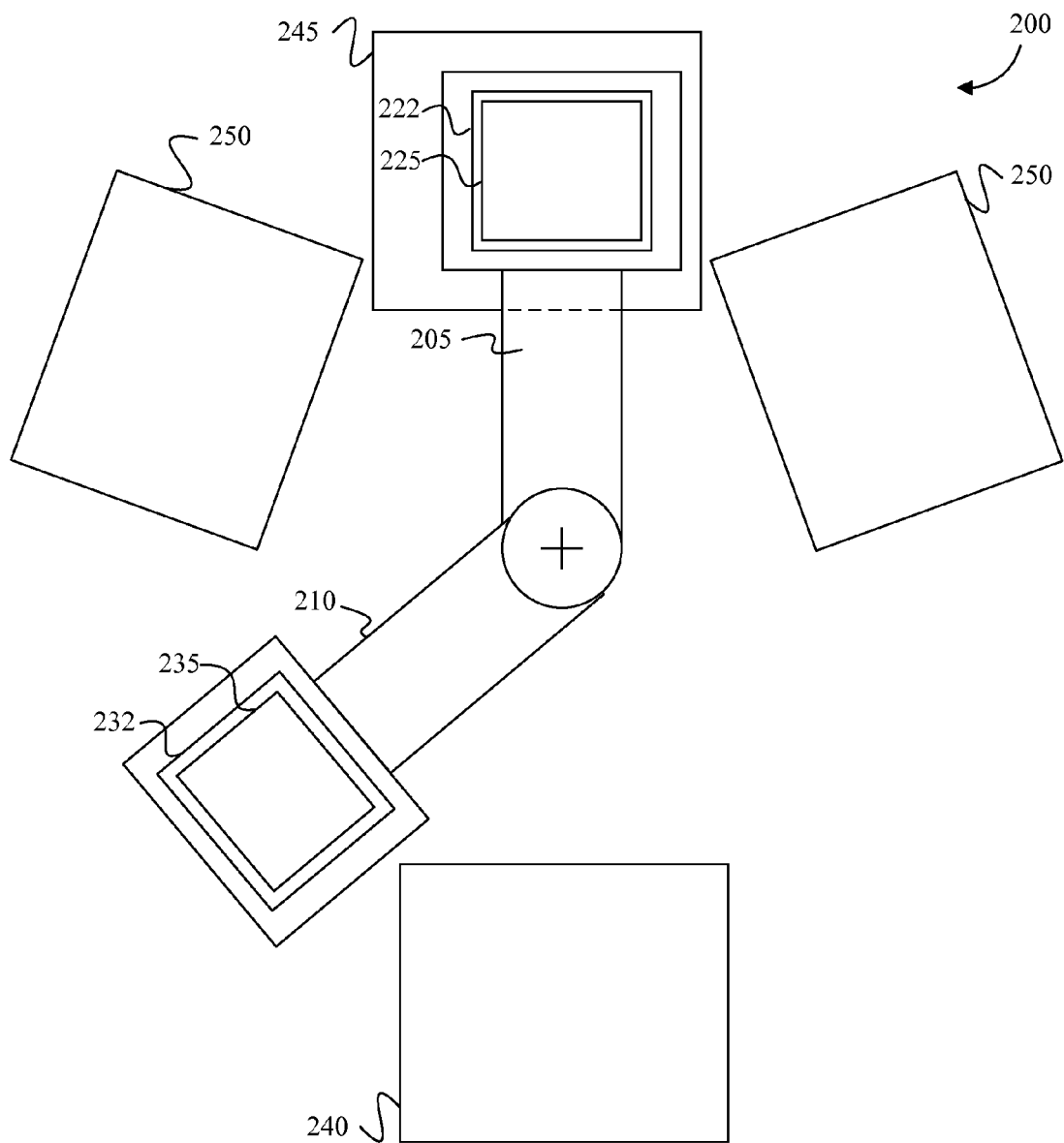
FIGS. 2D-E depict a top-view of a two-armed rapid exchange device, according to one embodiment of the present invention.
Figure 2E:
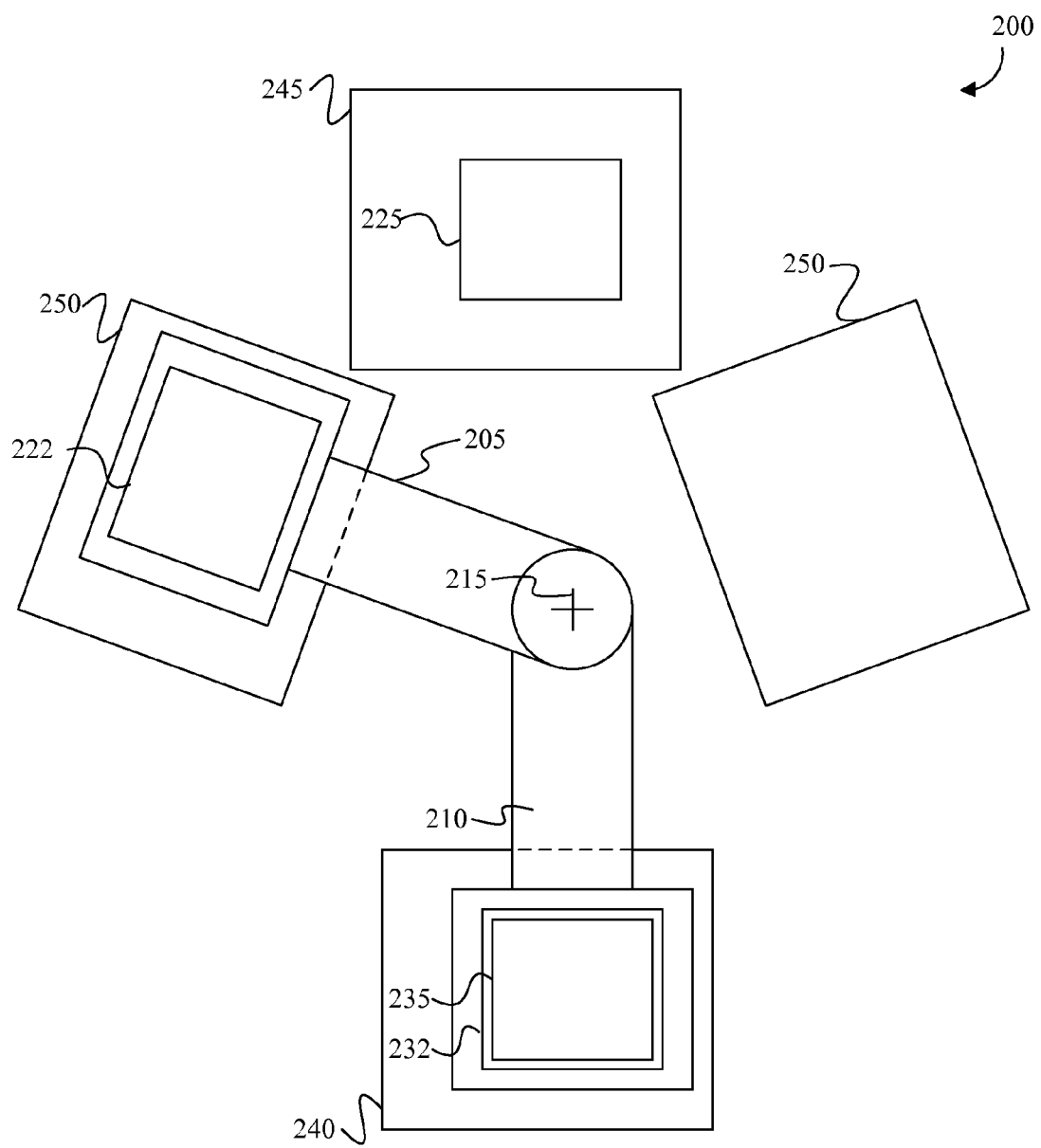

A combination of FIGS. 2A, 2D, and 2E illustrates exemplary dynamic operation of the two-armed RED 200. FIG. 2A shows the first arm 205 in the reticle loading and unloading position 240, where the first reticle 225 and baseplate 222 is loaded on the first arm 220. The two-armed rotational rapid exchange device 200 then rotates the first arm 205 to the reticle stage loading and unloading position 245 as shown in FIG. 2D. After the first reticle 225 is loaded to the reticle stage from the first baseplate 222, the first arm 205, still holding the first baseplate 222, is rotated to the baseplate buffering position 250, which is illustrated in FIG. 2E.

While the first arm 205 is in the baseplate buffering position 250, the first reticle 225, at position 245, is used to impart a radiation beam with the pattern in its cross-section, such as to create the pattern in a target portion of a substrate. When the first reticle 225 is no longer needed for patterning, the first arm 205, still holding the first baseplate 222, returns to the reticle stage loading and unloading position 245, where the first reticle 225 is unloaded from the reticle stage back onto the first baseplate 222. The two-armed rotational rapid exchange device 200 then rotates the first arm 205 back to the reticle loading and unloading position 240 as shown in FIG. 2A, where the first reticle 225 with the baseplate 222 is unloaded from the two-armed RED 200.

While the first baseplate 222 is buffered in the baseplate buffering position 250, the second reticle 235 is substantially simultaneously transferred at the reticle loading and unloading position 240 between the RED and the reticle storage device. Substantially simultaneous buffering of the first baseplate 222 and transfer of the second reticle 235 saves time and increases throughput of the RED 200 when compared to conventional reticle exchange devices.

FIGS. 6A-6G depict exemplary dynamic operation of a rotational rapid exchange device, such as the two-armed RED 200, according to an embodiment of the invention. In FIGS. 6A-6G, a reticle is identified by an identifier number "N." A reticle stage location is denoted by "RS." A location for the reticle handler is indicated as "RH." In one embodiment, operation of the rotational rapid exchange device as shown in FIGS. 6A-G is similar to that as described above with regard to the two-armed RED 200, with the exceptions of any differences depicted in FIGS. 6A-G, as would be apparent to a skilled artisan.

Figure 3A:
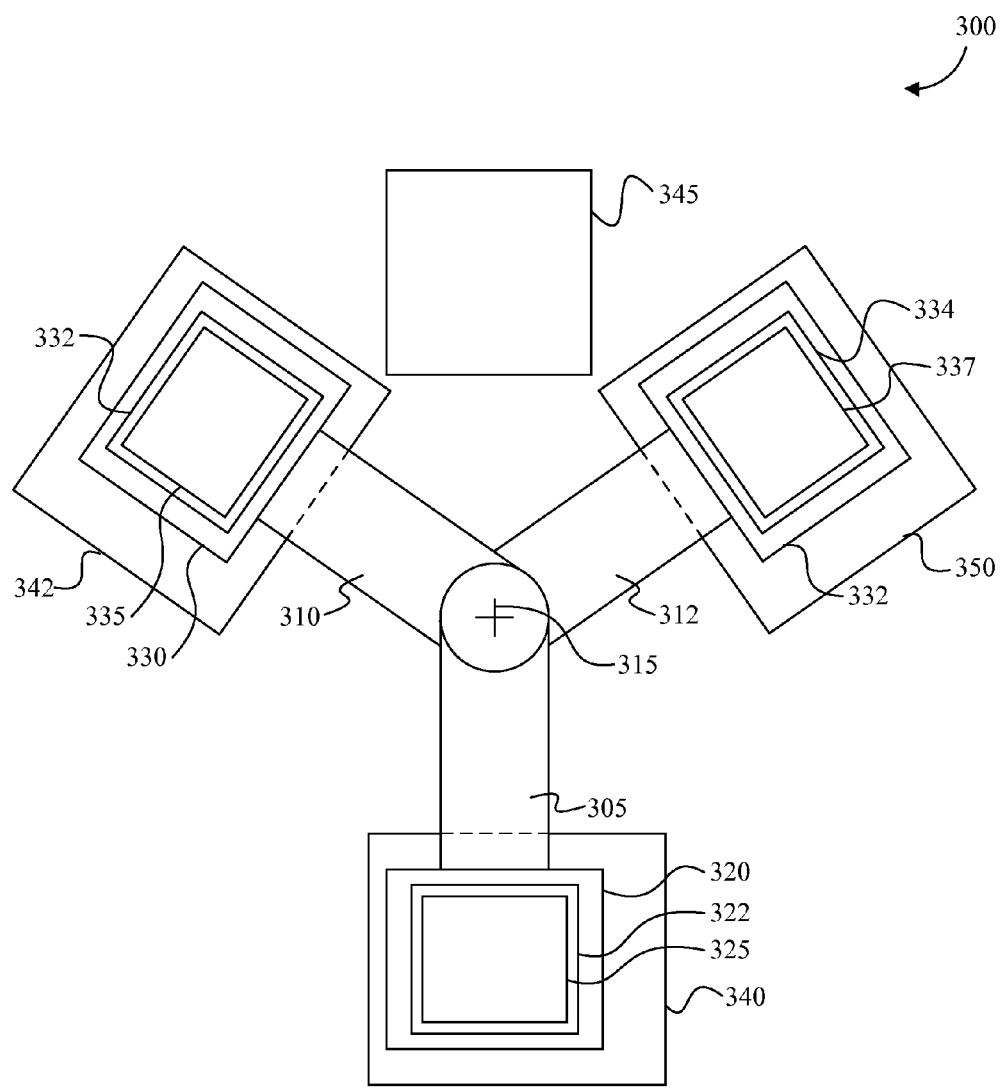
FIGS. 3A-D depict a top-view of a three-armed rapid exchange device, according to one embodiment of the present invention.

FIG. 3A depicts a top-view of the three-armed rotational rapid exchange device (RED) 300. The three-armed RED 300 has a first arm 305, a second arm 310, and a third arm 312 that rotate about a central axis 315, going into the page. At an end of the first arm 305 is a first robotic gripper 320 that is configured to grip a first baseplate 322, which is configured to hold a first reticle 325. Similarly, at the end of the second arm 310 is a second robotic gripper 330 that is configured to grip a second baseplate 332, which is configured to hold a second reticle 335. At the end of the third arm 312 is a third robotic gripper 332 that is configured to grip a third baseplate 334, which is configured to hold a third reticle 337. The first, second, and third baseplates 322, 332, 334 and the first, second, and third arms 305, 310, 312 are configured to rotate in unison. In an embodiment, the first, second, and third baseplates 322, 332, 334 are located substantially equidistant from the central axis 315.

According to an embodiment of the invention, the three-armed RED 300 rotates through four positions. The first position is a reticle loading and unloading position 340, where reticles and baseplates are loaded from a reticle storage device (not shown) onto a RED arm. In the reticle loading and unloading position 340, the first reticle 325 and the first baseplate 222 are either transferred to or from the first robotic gripper 320 to the reticle storage device. The second position is a reticle prealignment position 342. In the reticle prealignment position 342, the first reticle 325 is prealigned prior to transfer to a reticle stage (not show), such as the support structure MT in the lithographic apparatus 100, shown in FIG. 1. The third position is a reticle stage loading and unloading position 345. In the reticle stage loading and unloading position 345, the first reticle 325 is transferred between the first baseplate 322 and the reticle stage (not shown). The fourth position is a baseplate buffering position 350. When the first reticle 325 is located on the reticle stage, the three-armed RED 300 rotates the first robotic gripper 320 and the first baseplate 322 to the baseplate buffering position 350 to keep the three-armed RED 300 from interfering with use of the first reticle 325, for example during patterning of a beam of radiation for an exposure operation. In the various positions, the second reticle 335 may be processed and exchanged in a manner similar to that of the first reticle 325. Similarly, in the various positions, the third reticle 337 may be processed and exchanged in a manner similar to that of the first reticle 325. Dynamic operation of the three-armed RED 300 is now described in further detail.

Figure 3B:
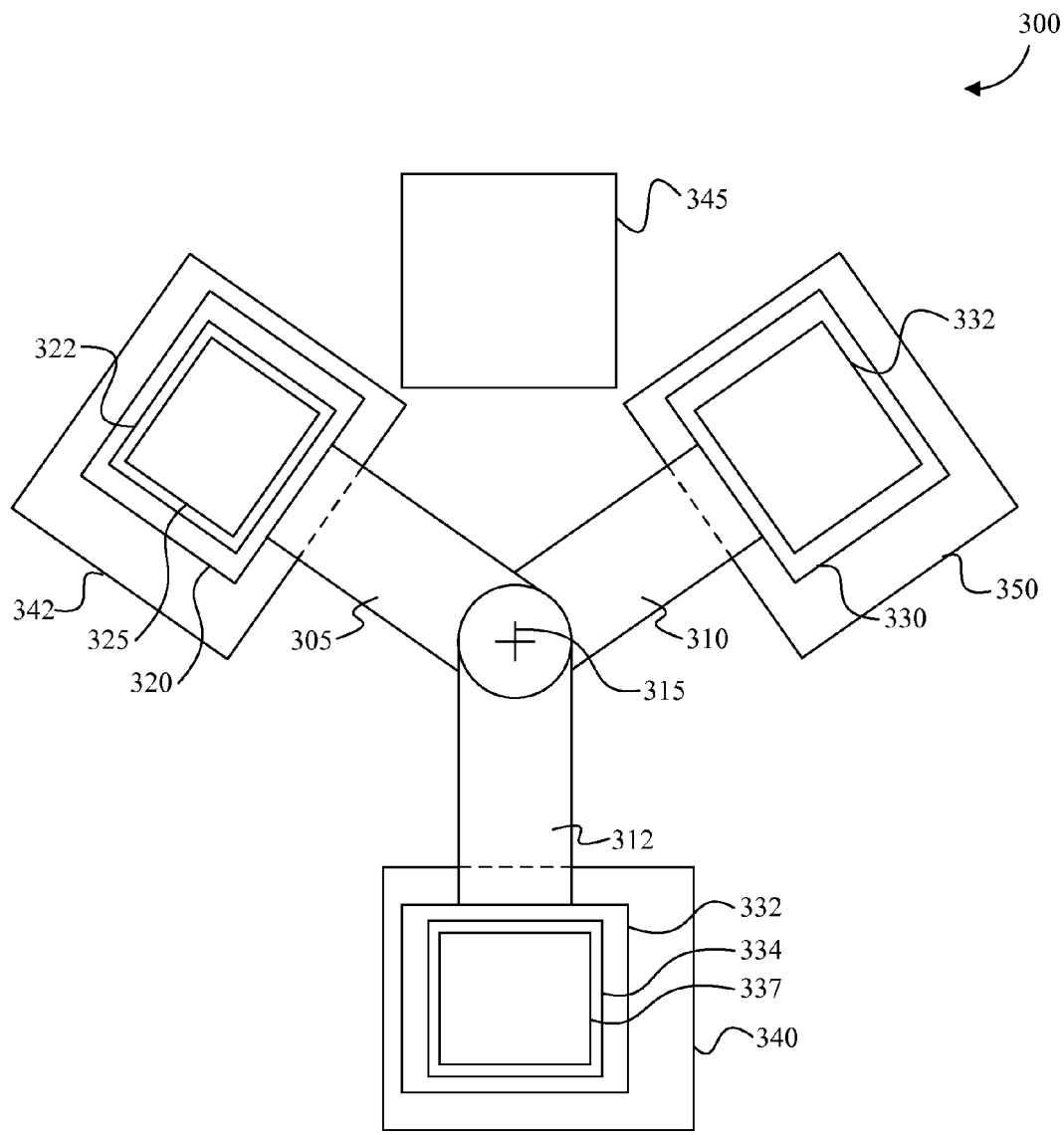
Figure 3C:
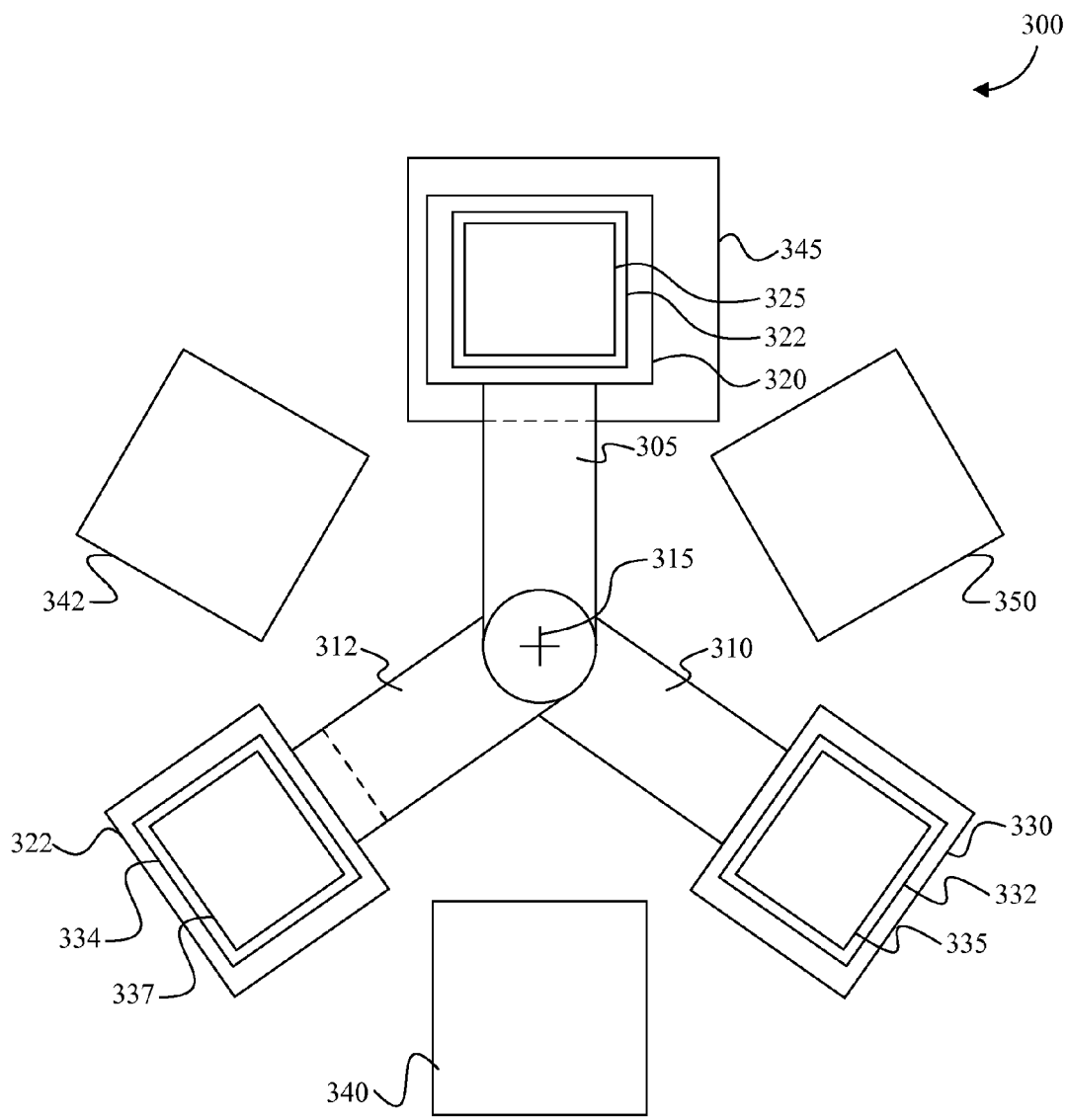
Figure 3D:
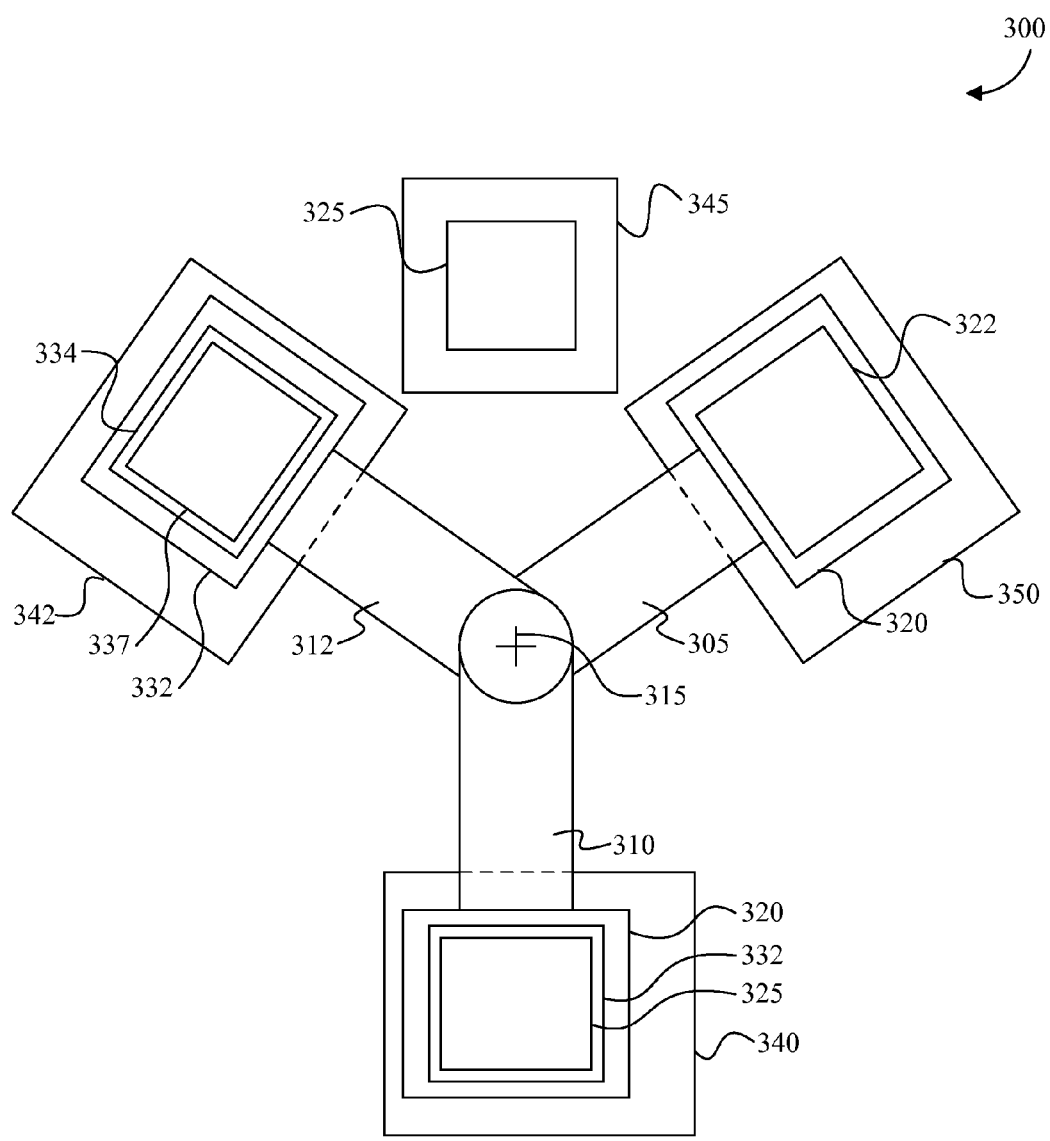

The combination of FIGS. 3A-D illustrate exemplary dynamic operation of the three-armed RED 300. FIG. 3A shows the first arm 305 in the reticle loading and unloading position 340, where the first reticle 325 and baseplate 322 is loaded on the first RED arm 305 from the reticle storage device by a first robotic device (not shown). The three-armed RED 300 then rotates the first arm 305 to the reticle prealignment position 342, as shown in FIG. 3B, where the first reticle 325 is prealigned. Following reticle prealignment, the three-armed RED 300 then rotates the first arm 305 to the reticle stage loading and unloading position 345, as shown in FIG. 3C. After the first reticle 325 is loaded to the reticle stage from the first baseplate 322, the first arm 305, still holding the first baseplate 322, is rotated to the baseplate buffering position 350, which is illustrated in FIG. 3D.

While the first arm 305 is in the baseplate buffering position 350, the first reticle 325 is used to impart a radiation beam with a pattern in its cross-section, such as to create the pattern in a target portion of a substrate. When the first reticle 325 is no longer needed for patterning, the first arm 305, still holding the first baseplate 322, returns to the reticle stage loading and unloading position 345, as shown in FIG. 3C, where the first reticle 325 is unloaded from the reticle stage back onto the first baseplate 322. The three-armed RED 300 then rotates the first arm 305 back to the reticle loading and unloading position 340 as shown in FIG. 3A, where the first reticle 325 with the first baseplate 322 is unloaded from the three-armed RED 300 by the first robotic device.

While the first reticle 325 is being prealigned in the reticle prealignment position 342, the second arm 310 is located in the baseplate buffering position 350, where the second baseplate 332 may be buffered. Also, while the first reticle 325 is being prealigned in the reticle prealignment position 342, the third arm 312 is located at the reticle loading and unloading position 340, where the third reticle 337 with the third baseplate 334 may be loaded onto, or unloaded from, the three-armed RED 300. Prealignment of the first reticle 325, buffering of the second baseplate 332, and transfer of the third reticle 337 is performed substantially simultaneously to save processing time and increase throughput of the three-armed RED 300 when compared to conventional vacuum reticle exchange devices such as a single arm vacuum robot. When the three-armed RED 300 is rotated, the first, second, and third baseplates 322, 332, 334 also rotate substantially simultaneously, so that multiple reticles are moved between the processing positions substantially simultaneously to save processing time and increase throughput of the three-armed RED 300 when compared to conventional reticle exchange devices.

Figure 4:
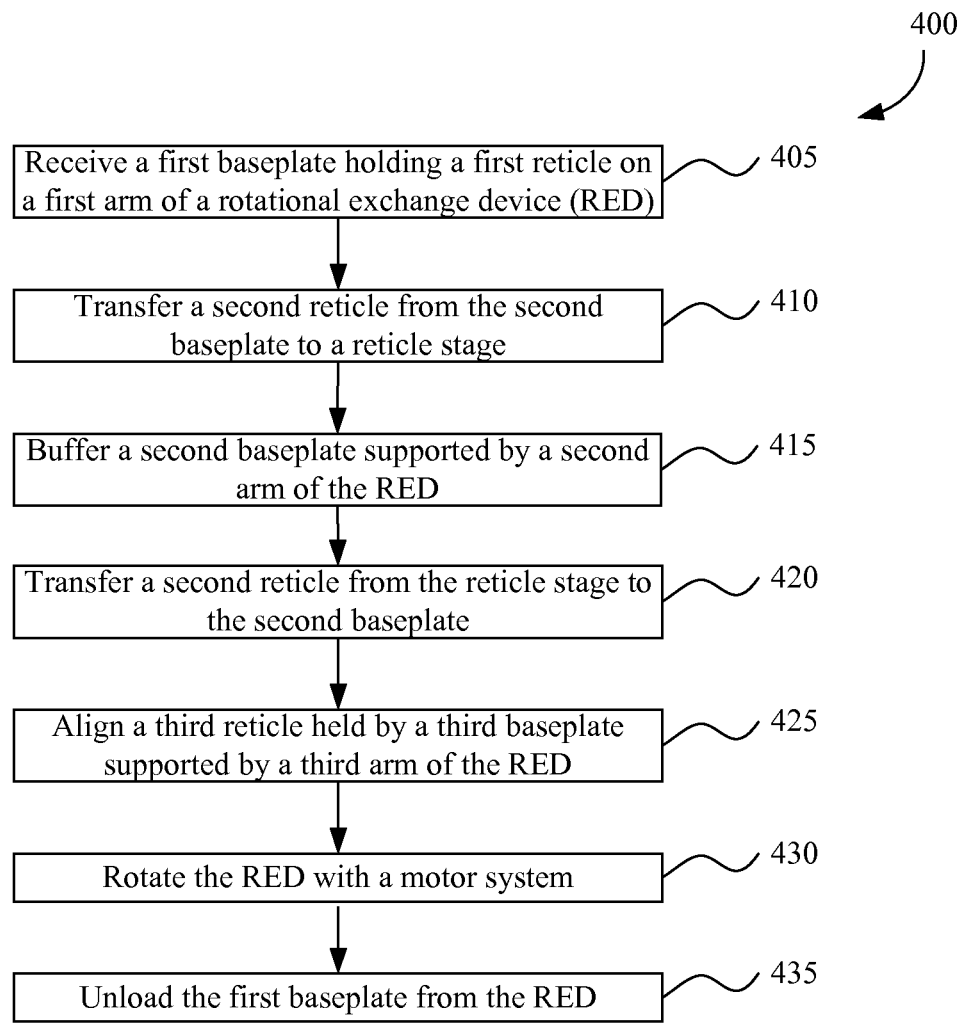
FIG. 4 depicts a method according to one embodiment of the present invention.

FIG. 4 is a flowchart that illustrates an exemplary method 400. For example, method 400 may be performed using the devices of FIGS. 1, 2A-E, and 3A-D. In step 405, a first baseplate holding a first reticle on a first arm of a rotational rapid exchange device (RED) is received. In step 410, a second reticle is transferred from the second baseplate to a reticle stage. In step 415, a second baseplate supported by a second arm of the RED is buffered. In one example, the first and second baseplates are located substantially equidistant from an axis of rotation of the RED. The buffering may optionally be performed simultaneously with the receiving. In step 420, a second reticle is transferred from the reticle stage to the second baseplate. In step 425, a third reticle held by a third baseplate supported by a third arm of the RED is prealigned.

In step 430, the RED is rotated with a motor system. The motor system is sealed in an evacuated chamber, such that outgassing and particle contamination from the motor system is substantially eliminated. The RED may be rotated to move any of the baseplates to any of the positions. For example, the RED may be rotated to move the first baseplate to a position that allows for prealignment of the first reticle or rotated to move the first baseplate to a position that allows for transfer of the first reticle to the reticle stage. Further, the RED may be rotated to move the first baseplate to a position that allows for transfer of the first reticle from the reticle stage to the first baseplate or rotated to move the first baseplate to a position that allows for buffering the first baseplate. In another example, the RED is rotated to move the first baseplate to a position that allows for transfer of the first baseplate off of the RED. In step 435, the first baseplate is unloaded from the RED.

All steps in the method 400, other than step 405 and step 415 are optional. In an embodiment, at least a part of the method 400 may be performed by at least a part of the lithographic apparatus 100, the two-armed RED 200, and/or the three-armed RED 300.

Figure 5:
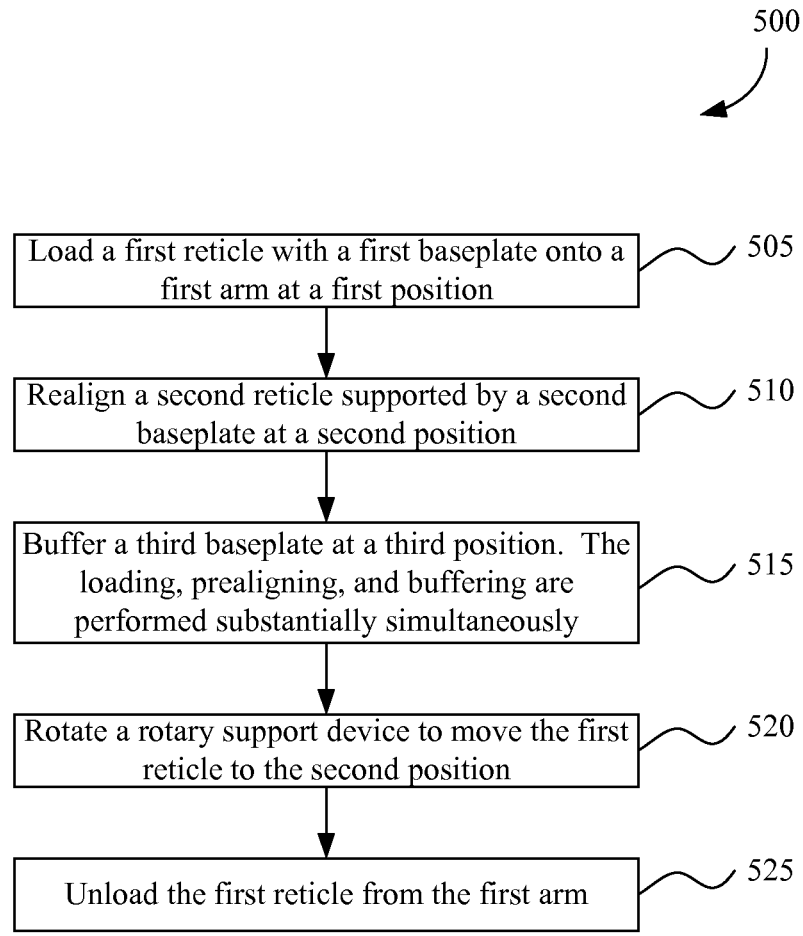
FIG. 5 depicts another method according to one embodiment of the present invention.
Figure 6:
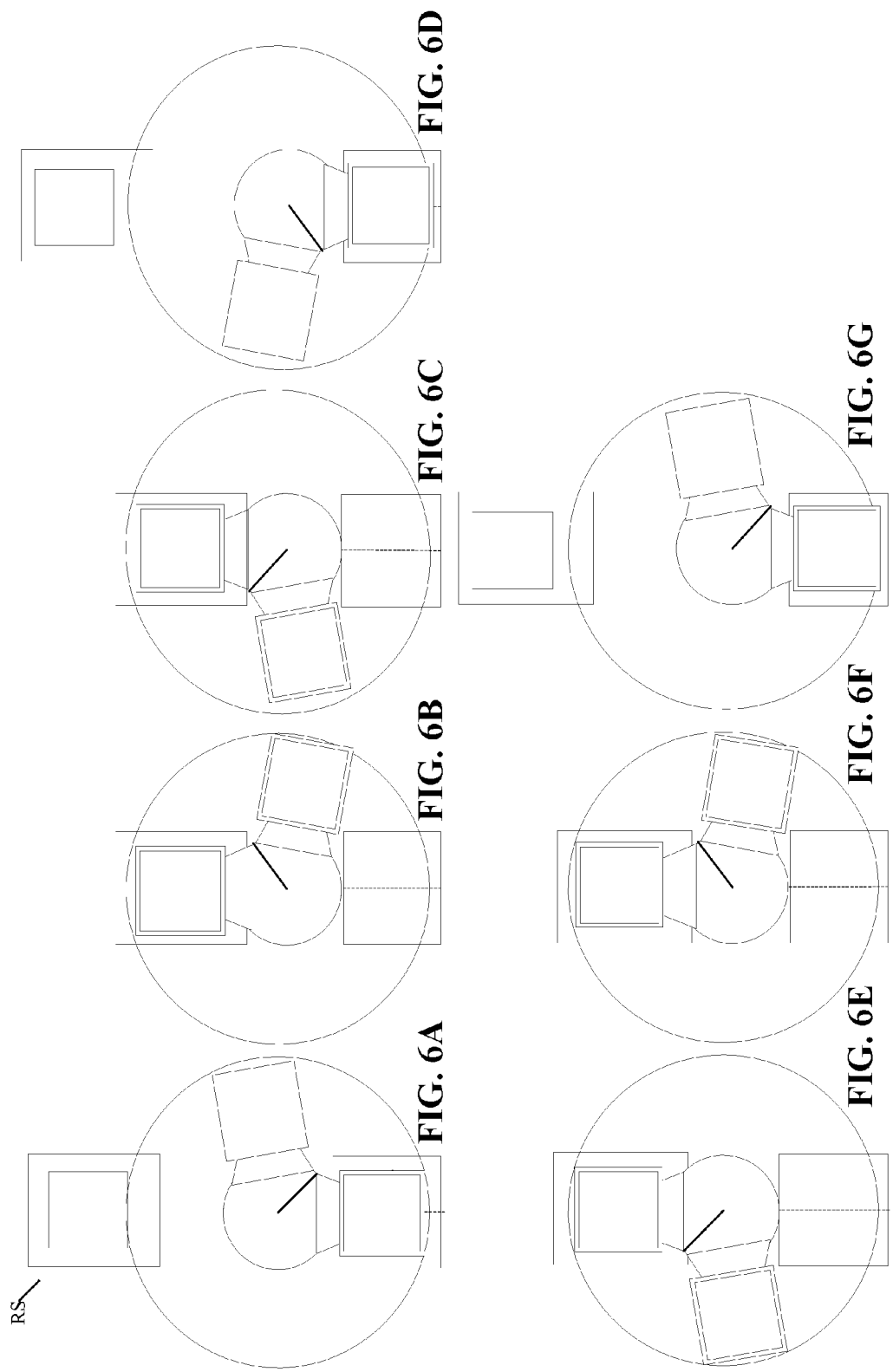
FIGS. 6A-G depict exemplary dynamic operation of a rapid exchange device according to one embodiment of the present invention.

FIG. 5 is a flowchart that illustrates an exemplary method 500. In an embodiment, at least a part of the method 500 may be performed by at least a part of the lithographic apparatus 100, the two-armed RED 200, and/or the three-armed RED 300. In step 505, a first reticle with a first baseplate is loaded onto a first position. In step 510, a second reticle supported by a second baseplate is prealigned at a second position. In step 515, a third baseplate is buffered at a third position. The loading, prealigning, and buffering may be performed substantially simultaneously. In step 520, the rotary support device is rotated to move the first reticle to the second position. In step 525, the first reticle with the first baseplate is unloaded from the first arm.

The discussion above discloses methods and systems for a RED (such as RED 200 or 300) to quickly and efficiently move reticles about in the vacuum environment of a lithography tool. What is yet to be described in detail is how a reticle is actually transferred from the RED (and baseplate) to a reticle stage. This may occur at, for example, reticle stage loading and unloading position 245 as shown in FIG. 2D.

In a conventional reticle exchange device, a vacuum gripper holds the reticle. The gripper may be compliant in all six degrees of freedom (DOF). Since the gripper may be compliant in all six DOF, the reticle stage can remain motionless during the transfer from the gripper to the reticle stage, letting the gripper align and deposit the reticle onto the reticle stage. The reticle stage may have a clamp to secure the patterning device. After the gripper has aligned the reticle and put it into contact with the reticle stage, the clamp activates to secure the reticle to the reticle stage and the gripper releases the reticle and moves away. From that moment forward, the reticle stage itself holds the reticle and complies in six DOF.

A six DOF gripper has advantages of a relaxed parallelism specificication between the reticle stage and the reticle handler as well as relaxed dynamic specifications on the reticle stage, since it is the gripper that aligns the reticle in all six DOF during the transfer, while the reticle may remain motionless and passively receive the reticle.

However, in a vacuum environment (for example an EUV environment), a conventional gripper has distinct disadvantages. First, a vacuum gripper would not function in a vacuum environment. Second, if the reticle is inverted (for example, MA shown in FIG. 1 is "inverted," wherein the illuminator IL projects upwardly to the reticle MA, which in turn reflects downwardly to projection system PS), the handler must hold the reticle form the bottom, making gravity release ineffective. Third, the volume available for a RED device may be limited in the EUV environment because the RED may reside between the projection optics (e.g., PS in FIG. 1) and the reticle stage (e.g., MT in FIG. 1). For these reasons, a fully six DOF compliant gripper may not be feasible in a reduced volume environment.

For the above reasons, in one embodiment consistent with the present invention, a RED will only be compliant in less than six DOF. Even if a RED is compliant in less than six DOF, there is still a necessity to control the reticle in six DOF as it is being transferred to the reticle stage. For this reason, the RED and reticle stage must cooperate together to achieve compliance in all six DOF. Since both the RED and the reticle stage may be servo-controlled mechetronic devices, there is a danger that they may "fight" each other during the transfer. This danger arises because each device is compliant in one or more DOF. To avoid this problem, control among the DOFs must be allocated between the two devices in an appropriate way. For example, in one embodiment consistent with the present invention, the RED provides compliance in the "horizontal" DOFs while the reticle stage provides compliance in the "vertical" DOFs. Sharing compliance in this manner reduces or eliminates the danger of servo-controlled devices fighting with each other. Shared compliance is explained in greater detail below.

Figure 7:
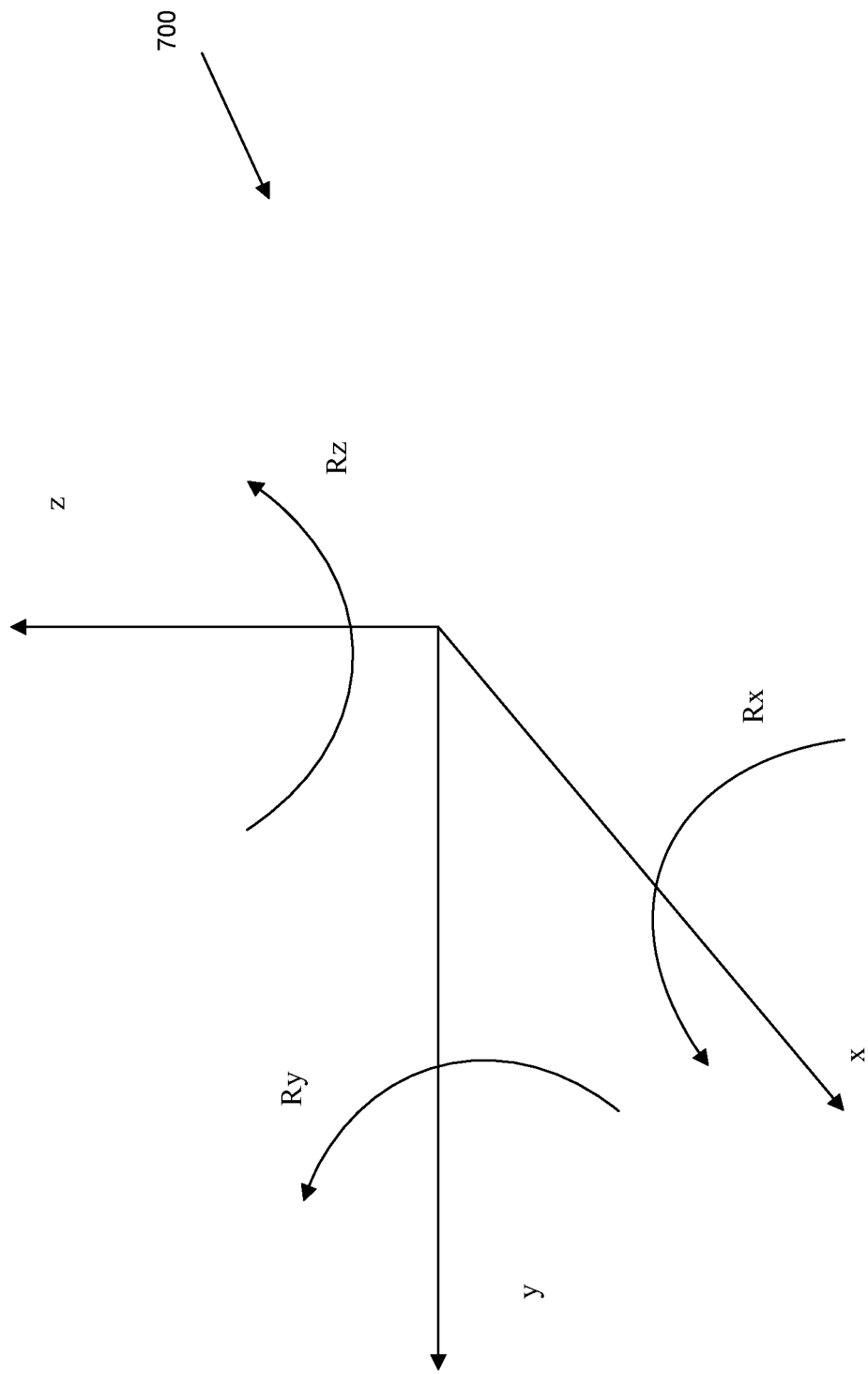
FIG. 7 depicts an x-y-z coordinate system according to one embodiment of the present invention.

Referring to FIG. 7, an x-y-z coordinate system 700 consistent with one embodiment of the present invention is presented. The three axes (x, y, and z) are mutually perpendicular. Coordinate system 700 may be a right-handed or a left-handed system. Rotations about the x-axis are denoted as Rx, rotations about the y-axis are denoted as Ry, and rotations about the z-axis are dentoed as Rz. In one embodiment, the x-y plane coincides with a "level" position of a reticle. For exemplary purposes, the x-y plane is depicted on reticle 225 in FIG. 2A. In the level position, Rx and Ry are both zero. For exemplary purposes, the level position is depicted in FIG. 2B, wherein the z-axis is oriented vertically upward, and the x axis is oriented radially outward. The level position may coincide with the local earth level (i.e., parallel with the floor), but this is not a limitation of the invention. For example, in one embodiment, the x-y plane may make any angle with local earth level. Therefore, as used herein, the term "level" does not necessarily imply any specific orientation with respect to earth, unless otherwise noted. Similarly, the directions "x," "y," and "z," and the rotations "Rx," "Ry," and "Rz" do not imply any specific orientation with respect to earth, but only with respect to coordinate system 700, whose orientation may be arbitrary.

As noted above, in one embodiment, a RED provides compliance in horizontal DOFs. Referring to coordinate system 700, the "horizontal" DOFs are x and y translations and Rz rotations. These DOFs are referred to as being "horizontal" because if an object moves in any of these three DOFs, no point in that object will translate with a component of motion along the z axis, which is the vertical axis. Rather, points in the object are constrained to move horizontally (i.e., with components of motion along the x and/or y axes only). Also as noted above, in one embodiment, a reticle stage provides compliance in "vertical" DOFs. The vertical DOFs are z-translation and Rx and Ry rotations. These DOFs are referred to as being "vertical" because if an object moves in any of these three DOFs, points in that object will translate parallel to the z axis (the vertical axis), and will have no components of motion along either of the x or y axes (the horizontal axes).

Allocating horiztonal and vertical compliance between a RED and a reticle stage allows for a patterning device to be transferred from the RED to the reticle stage in six DOF without having the RED and reticle stages (which may be servo-actuated) fight each other.

In one embodiment consistent with the present invention, a lithographic apparatus capable of operating in the EUV environment may have a reticle with no pellicle. In this case, an EUV inner pod (not shown) can serve as a removable pellicle. A part of the EUV inner pod is a baseplate that the reticle sits on so that the reticle handler (for example, a RED) does not directly touch the reticle. An embodiment is illustrated, for example, in FIGS. 2A-2C wherein reticle 225 is positioned on baseplate 222. In this implementation, gripper 220 of RED 200 grips baseplate 222 without directly touching the reticle.

Figure 8:
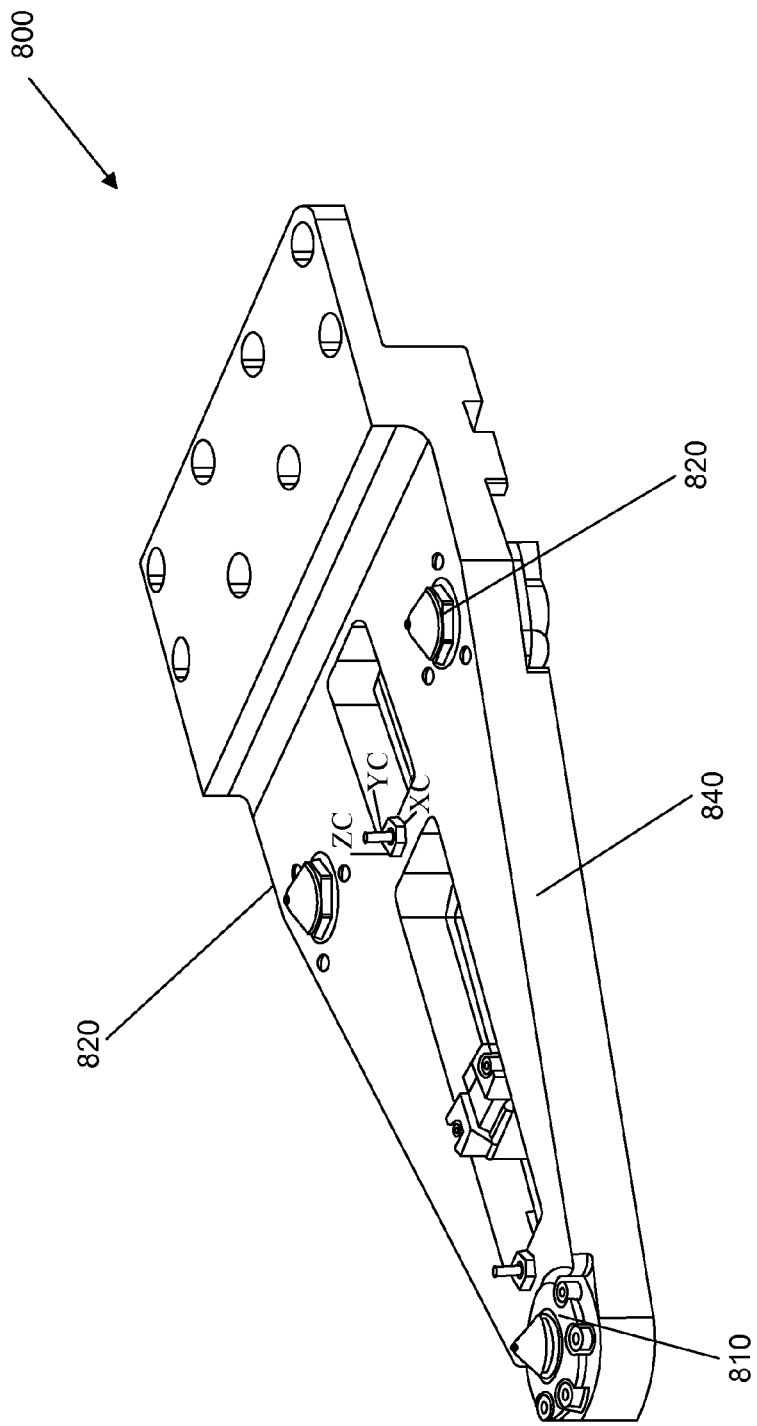
FIG. 8 depicts a gripper according to one embodiment of the present invention.
Figure 9:
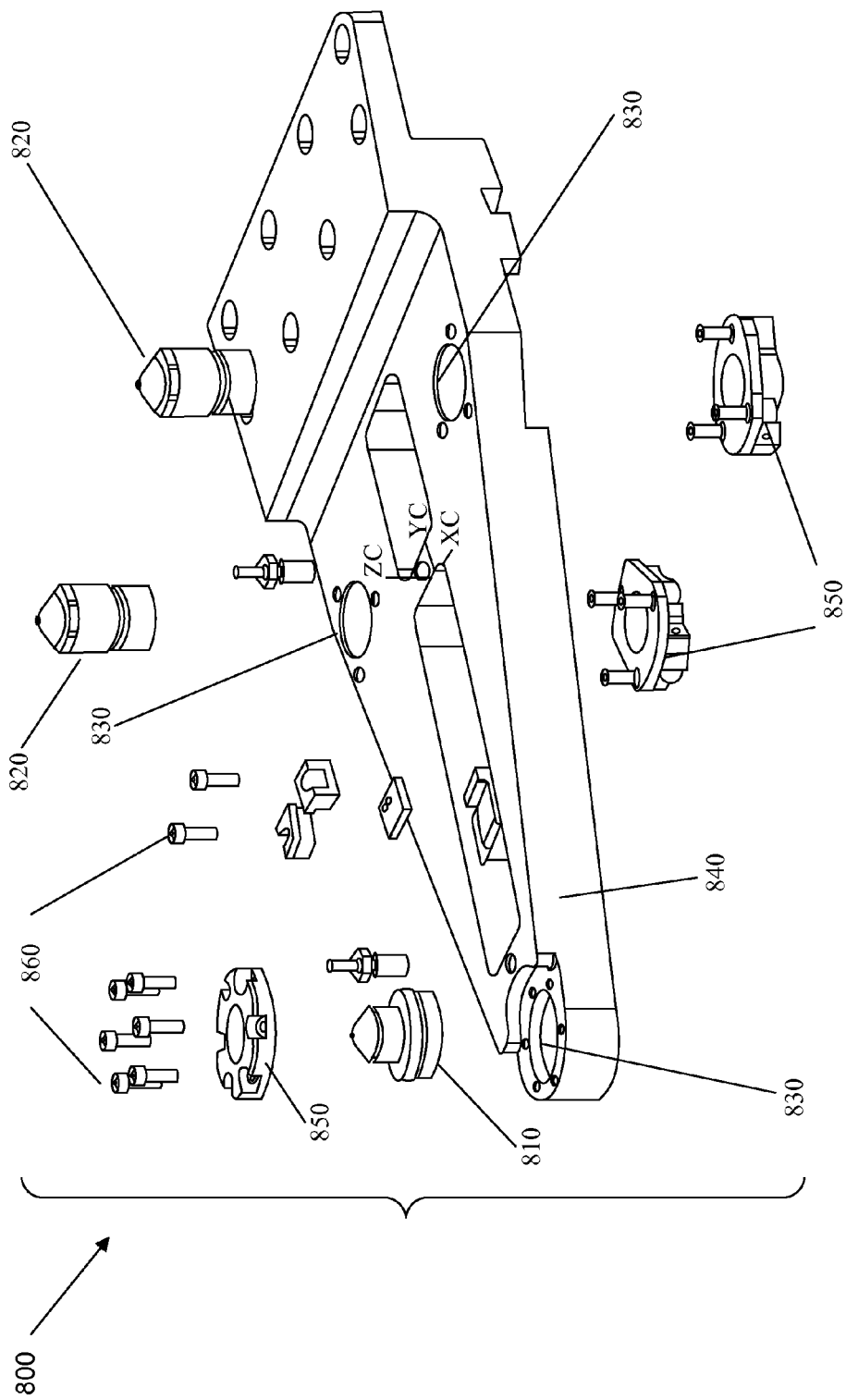
FIG. 9 depicts an exploded view of a gripper according to one embodiment of the present invention.

An embodiment of a gripper 800 consistent with the present invention is schematically shown in FIG. 8 and schematically shown in exploded view in FIG. 9. Gripper 800 is configured to engage a baseplate of an EUV inner pod. In one embodiment, gripper 800 engages a baseplate using pins. In the illustrated embodiment, gripper 800 includes three compliant pins: front compliant pin 810 and two rear compliant pins 820. The pins are mated through holes 830 in gripper plate 840. The pins may be secured with, for example, clamps 850 and pins 860, or other retaining means as is known in the art. The compliant pins 810, 820 form a kinematic mount for a patterning device. In one embodiment, the patterning device may be on a baseplate; the baseplate may be mounted to the gripper with the kinematic mount.

FIGS. 10A-10E schematically show steps in a sequence consistent with one embodiment of the present invention to load a reticle (patterning device) 1010 onto a reticle stage 1020 of a lithography system. In the illustrated embodiment, reticle 1010 is sitting on an EUV inner pod baseplate 1030. In one embodiment, baseplate 1030 is engaged by a gripper (not shown) of a RED. For example, gripper 800 may be a part of a RED used to engage baseplate 1030. The RED positions the gripper, which in turn engages baseplate 1030, thereby positioning reticle 1010. In the illustrated embodiment, baseplate 1030 has grooves 1040 on the bottom. Grooves 1040 coincide with locations of compliant pins 810 and 820. The compliant pins engage the baseplate 1030 at the grooves 1040.

Reticle 1010 and baseplate 1030 are schematically shown as being tilted in FIG. 10A with respect to the reticle stage 1020. The tilt is greatly exaggerated for purposes of explanation. Such a tilt can arise because it is practically impossible to fabricate a reticle or a baseplate that is completely level. In practice, these articles will exhibit a wedge characteristic; one end is thicker than the other due to manufacturing imperfections. Other sources of tilt arise from RED calibration accuracy and RED repeatability accuracy. Due to this tilt, or other factors, the reticle 1010 and reticle stage 1020 may not be parallel to one another before they are in contact, as is depicted in FIG. 10A.

As shown schematically in FIG. 10A, baseplate 1030 is first brought into the vicinity of reticle stage 1020. In one embodiment, a RED (not shown) positions baseplate 1030 to this position. In one embodiment, this position may coincide with that shown in FIG. 2D, wherein RED 200 transports a reticle 222 into the vicinity of a reticle loading and unloading position 245. Position 245 may be under a reticle stage of a lithographic system. In this position, a gap 1050 exists between reticle stage 1020 and patterning device 1010.

In one embodiment consistent with the present invention, the baseplate 1030 is moved up to be in close proximity to the reticle stage 1020, as shown in FIG. 10B. In this configuration, the gap 1050 has been reduced in size and is shown as a smaller gap 1050'. At this point, the reticle stage 1020 and patterning device are still not in contact with each other. Moving the baseplate 1030 up to reduce the separation between the patterning device 1010 and the reticle stage 1020 is optional. In another embodiment a RED may position baseplate 1030 to be in close proximity to reticle stage 1020 by moving horizontally without needing an extra step of moving up.

Figure 10D:
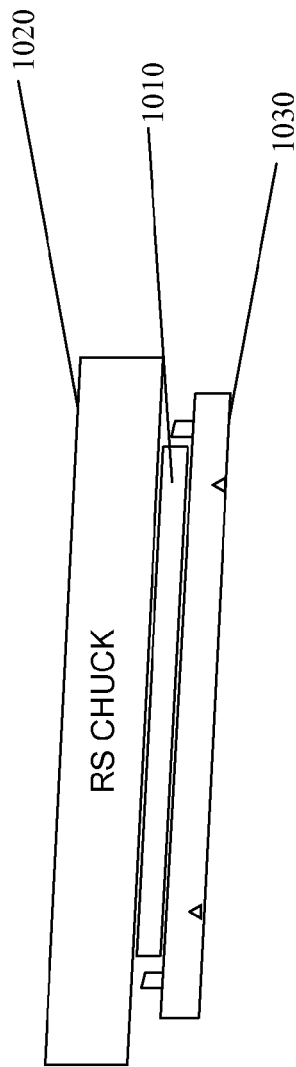
Figure 10E:
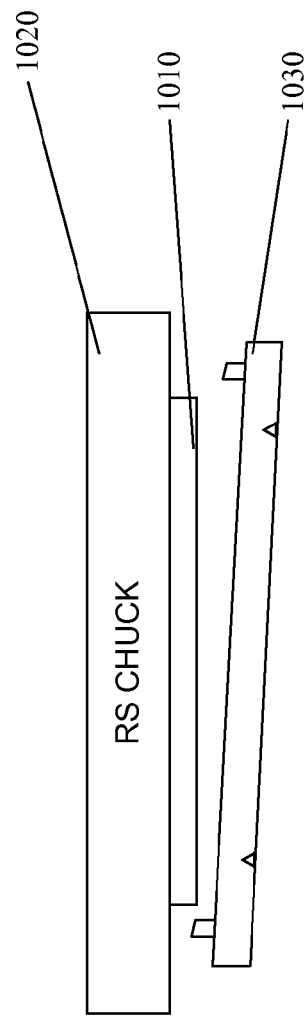

Once the reticle stage 1020 and patterning device 1010 are in close proximity to each other, the reticle stage 1020 is moved to initiate contact with the patterning device. In one embodiment, the reticle stage 1020 is moved down to initiate contact. Due to inherent tilt (which is shown greatly exaggerated in FIG. 10C) or other factors, reticle stage 1020 may first contact patterning device 1010 along one side 1060 or the other, as shown in FIG. 10C. In practice, reticle stage 1020 may first contact patterning device 1010 at a single point (i.e., at a zero-dimensional contact point). As the reticle stage continues moving down, contact is made along a line (i.e., a one-dimensional contact line), for example along side 1060. The goal is to mate patterning device 1010 flush with reticle stage 1020 (i.e., two-dimensional or substantially coplanar contact as is seen in FIG. 10D and FIG. 10E). How this is achieved will be explained below.

In one embodiment consistent with the present invention, reticle stage 1020 is moved down via a servo-actuator (not shown). The servo-actuator may use proportional control. In one embodiment, the servo-actuator initially commands reticle stage 1020 down at a constant acceleration in order to achieve a desired velocity. Once the desired velocity is reached, reticle stage 1020 continues moving down (thereby decreasing the gap 1050 shown in FIG. 10A to gap 1050' shown in FIG. 10B) at the constant velocity until contact is first made (e.g., first contact at side 1060 shown in FIG. 10C). Once contact is made, patterning device 1010 and reticle stage 1020 exert a reaction force on one another. In one embodiment, this reaction force is monitored.

When contact is made, the RED (not shown) and the reticle stage 1020 share compliance in order to avoid fighting one another, and also to reduce particle generation by limiting relative movement between the patterning device 1010 and reticle stage 1020. As previously noted, compliance can be shared by allocating compliance among the DOFs so that only one device is compliant in the horizontal DOFs, while the other device is compliant in the vertical DOFs. This is explained in greater detail below.

In one embodiment consistent with the present invention, the patterning device 1010 may be controlled to be compliant in only a first three DOFs. In one implementation, the first three DOFs are the horizontal DOFs: translations along the x-axis, translations along the y-axis, and rotations about the z-axis. Patterning device 1010 is secured to baseplate 1030. In one embodiment, baseplate 1030 is positioned on the RED with a kinematic mount comprising compliant pins. The compliant pins allows for compliance in the first three DOFs. Exemplary compliant pins 810 and 820 were discussed above with reference to FIG. 9 and FIG. 10.

Figure 11:
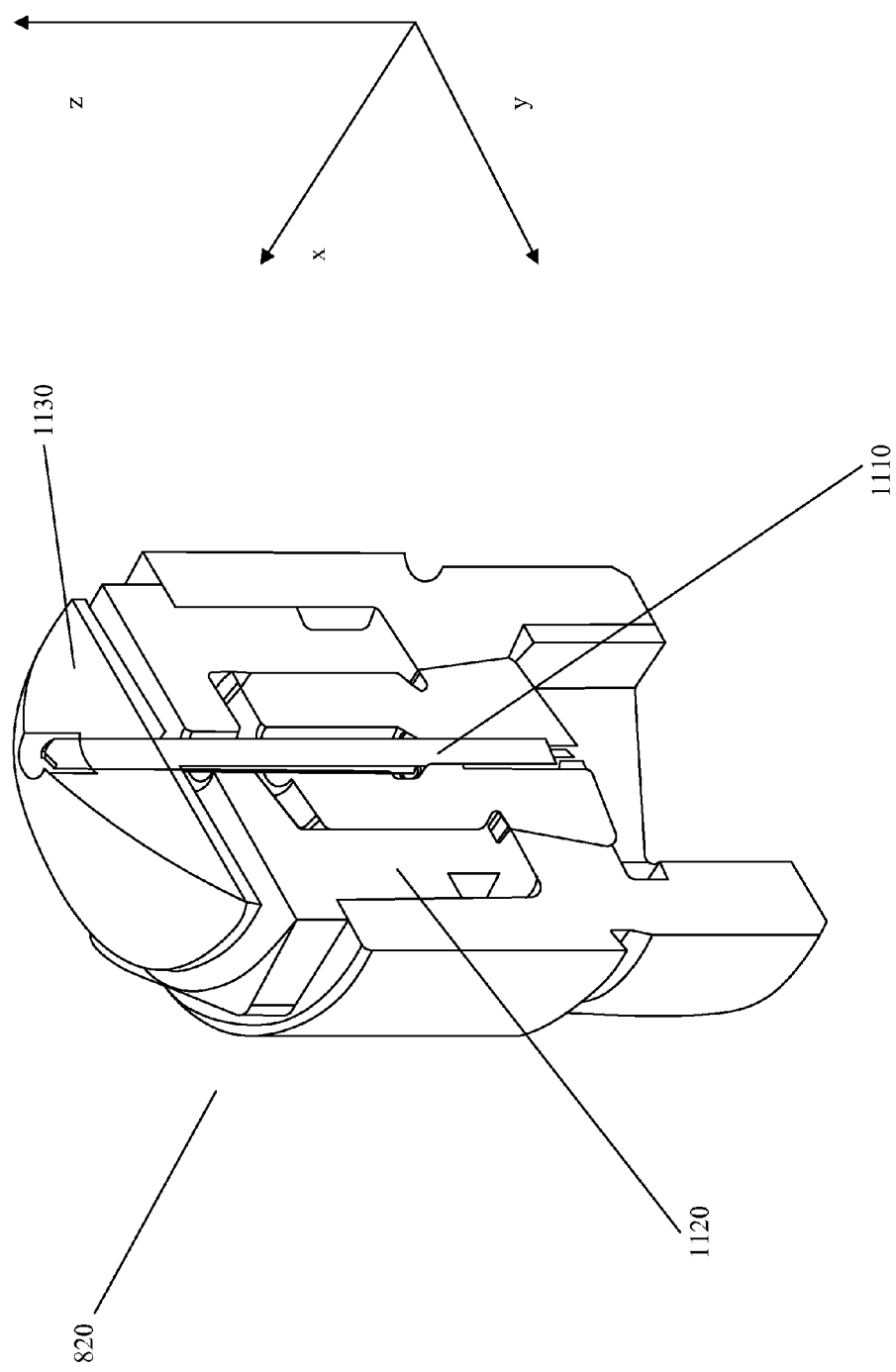
FIG. 11 depicts a schematic cut-away view of a compliant kinematic pin according to one embodiment of the present invention.
Figure 12:
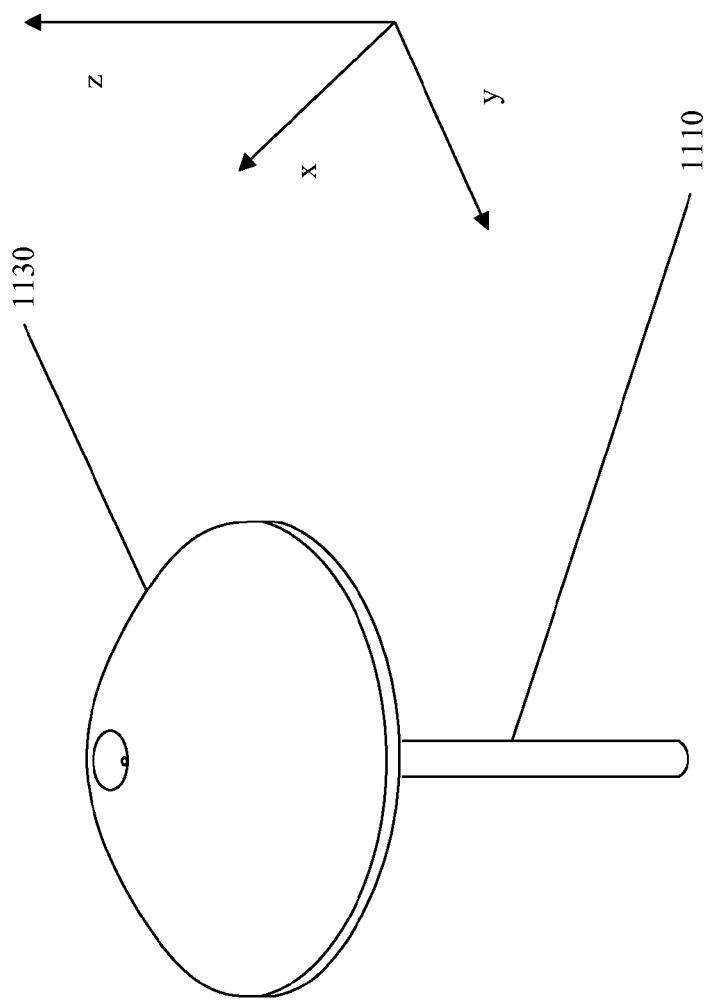
FIG. 12 schematically depicts portions of a compliant kinematic pin according to one embodiment of the present invention.

A schematic cut-away view of compliant kinematic pin 820 is presented in FIG. 11. A cut-away view of compliant kinematic pin 810 is similar and need not be separately shown. Compliant kinematic pin 820 has a compliant pin flexure 1110 extending through a stop collar 1120 to the head 1130 of the pin. FIG. 12 schematically shows other parts of the pin removed to reveal details of only pin flexure 1110 and head 1130. Compliance is principally achieved by adjusting the geometry and materials of the flexure 1110.

When reticle stage 1020 and patterning device 1010 are in contact with one another, they exert forces and torques on each other. When an object is subjected to forces and torques, it tends to translate and rotate in proportion to the direction and magnitude of the applied forces and torques. The forces and torques can be resolved into components in the x, y, and z directions. Pin shaft 1110 can undergo a torsion about its own axis. This provides compliance in rotations about the z-axis. However, compliant pin is restricted from rotating about the x or y axes. The compliant pin (810, 820) is also restricted from translations along the z axis; however, it can comply in translations along the x and y axes. In one embodiment, these x and y translations are on the order of 100 microns. In this way, the patterning device 1010 is controlled to be compliant in the first three DOFs (the horizontal DOFs: translations along the x-axis, translations along the y-axis, and rotations about the z-axis) after it comes into contact with the reticle stage 1020 (See FIG. 10C - FIG. 10D).

In one embodiment consistent with the present invention, the reticle stage 1020 may be controlled to be compliant in only a second three DOFs. In one implementation, the second three DOFs are the vertical DOFs: z-translation and Rx and Ry rotations. As previously explained, in one embodiment the reticle stage 1020 is commanded down in order to initiate contact with patterning device 1010 which provides z-translation compliance. In one embodiment, a servo-actuator holds the reticle stage 1020 in a nominally level position. In this context, level is with respect to the earth's surface, not with respect to the plane of patterning device 1010, which may be tilted at some angle (as shown in FIG. 10A through FIG. 10D). Once the reticle stage 1020 makes contact with patterning device 1010 (See FIG. 10C), the reticle stage 1020 is allowed to comply in Rx and Ry rotations. In one embodiment, this is accomplished by reducing a gain of the servo-actuator controlling the reticle stage. In one embodiment, the servo-actuator is the reticle stage short-stroke module. In one embodiment, the gain is proportional gain. Reducing a gain will allow the reticle stage 1020 to rotate about the x and y axes in response to the reaction force and reaction torques from the tilted patterning device 1010. In this way, the reticle stage 1020 is compliant in the second three compliant DOFs (the vertical DOFs) after it comes into contact with the patterning device 1010 (See FIG. 10C-FIG. 10D).

Allowing the reticle stage 1020 to have compliance in the vertical DOFs helps to allow it to rotate to be substantially coplanar and in contact with patterning device 1010, as shown in FIG. 10D. As noted, patterning device 1010 may have a tilt due to manufacturing imperfections or other reasons; therefore, it is mandatory that either the patterning device 1010 or reticle stage 1020 be able to comply to achieve a substantially coplanar state. In the illustrated embodiment, it is the reticle stage 1020 that rotates (Rx and Ry) in order to account for any tilt in the patterning device 1010 with respect to the reticle stage 1020. Allowing the pattering device 1010 to have compliance in the horizontal DOFs (x, y, Rz) substantially eliminates relative movement, and therefore particle generation, between it and the reticle stage 1020 while they are in contact.

Once the reticle stage 1020 and patterning device 1010 are substantially coplanar and in contact, as shown in FIG. 10D, the reticle stage 1020 is ready to receive the patterning device 1010 from the baseplate 1030. In one embodiment, baseplate 1030 is attached to a gripper of a RED. As noted, the contact force between the patterning device 1010 and reticle stage 1020 may be monitored. In one embodiment consistent with the present invention, a clamp (not shown) is activated to secure the patterning device 1010 to the reticle stage 1020 when the monitored force reaches a preset threshold. This is done to ensure that the clamp is not prematurely activated before the patterning device 1010 and reticle stage 1020 are substantially in contact and coplanar. In one embodiment, the clamp is activated when the configuration shown in FIG. 10D is achieved. In one embodiment, the clamp is an electrostatic clamp. In one embodiment, the clamp is a part of the reticle stage.

When the clamp is activated, the reticle stage 1020 secures the pattering device 1010 and then moves up and away from baseplate 1030, as shown in FIG. 10E. Also, reticle stage 1020 then rotates back to a nominally level position. In one embodiment, this nominally level position is with respect to gravity. If a gain on the reticle stage servo-actuator had been reduced while the reticle stage 1020 and patterning device 1010 were in contact, the gain can be increased to its normal level at this time.

Figure 13:
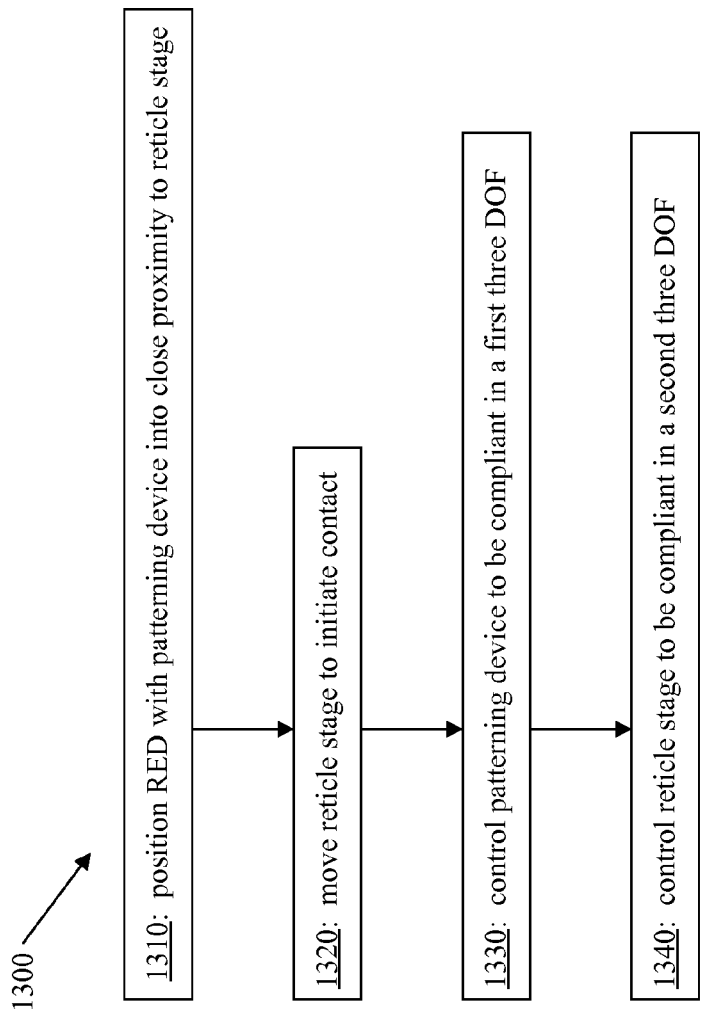
FIG. 13 depicts another method according to one embodiment of the present invention.

A flowchart of a method to load a patterning device onto a reticle stage of a lithography system consistent with one embodiment of the present invention is presented in FIG. 13. In block 1310, a RED is positioned in close proximity to the reticle stage; the RED having the patterning device positioned thereon. In block 1320, the reticle stage is moved to initiate contact with the patterning device. In block 1330, the patterning device is controlled to be compliant in a first three degrees of freedom until the reticle stage and patterning device are substantially in contact and coplanar. In block 1340, the reticle stage is controlled to be compliant in only a second three degrees of freedom until the reticle stage and patterning device are substantially in contact and coplanar. The first and second three degrees of freedom in blocks 1330 and 1340 are different. In one embodiment, blocks 1330 and 1340 occur substantially simultaneously.

In one embodiment consistent with the present invention, controlling the patterning device to be compliant in the first three degrees of freedom in block 1330 includes controlling translations along an x-axis and a y-axis and rotations about a z-axis defined perpendicular to the both the x-axis and the y-axis. In one embodiment method 1300 further comprises positioning the patterning device on the RED with a kinematic mount comprising compliant pins; wherein the kinematic mount allows for compliance in the first three degrees of freedom. In one embodiment, the compliant pins comprise pin flexures.

In one embodiment consistent with the present invention, controlling the reticle stage to be compliant in the second three degrees of freedom in block 1340 includes controlling translations along a z-axis and rotations about an x-axis and about a y-axis. In one embodiment, method 1300 further comprises controlling the movement of the reticle stage with a servo-actuator. In one embodiment, the method 1300 further comprises reducing a gain of the servo-actuator after the reticle stage and patterning device are in contact to allow for the rotations about an x-axis and about a y-axis in the second three degrees of freedom.

In one embodiment consistent with the present invention, method 1300 further comprises monitoring a force between the reticle stage and the patterning device while they are in contact. In one embodiment, method 1300 further comprises activating a clamp to secure the patterning device to the reticle stage when the monitored force reaches a preset threshold.

Figure 14:
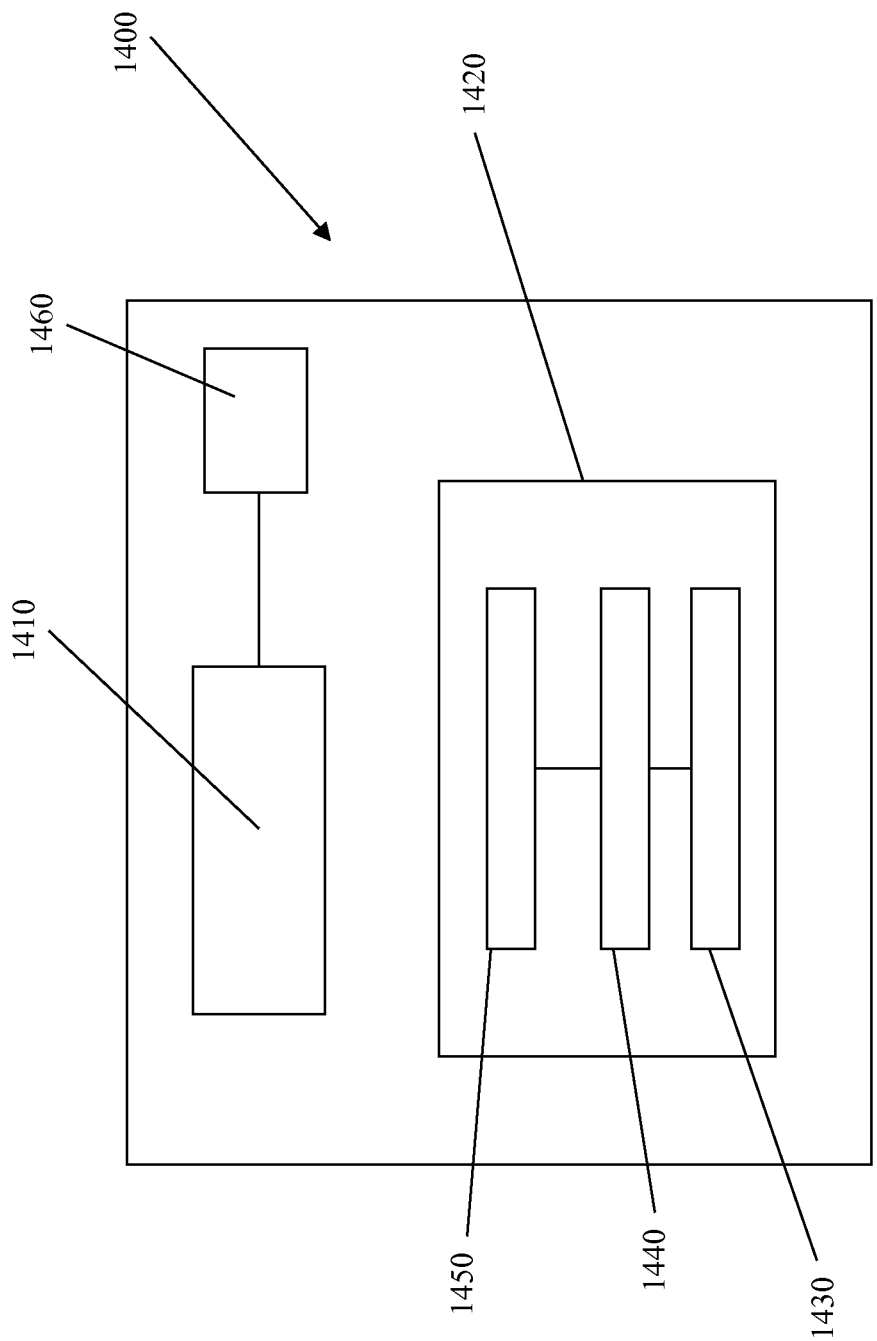
FIG. 14 schematically depicts a system for manufacturing a semiconductor device lithographically.

An embodiment of a system 1400 for manufacturing a semiconductor device lithographically consistent with present invention is schematically depicted in FIG. 14. System 1400 comprises a reticle stage 1410 and a RED 1420. RED 1420 comprises a gripper 1430 and a kinematic mount to position a patterning device (not shown). The kinematic mount comprises pin flexures 1440. In one embodiment, the pin flexures 1440 are included as a part of compliant pins. The pin flexures 1440 allows the patterning device to move in only a first three DOF. In one embodiment, the first three DOF are translations along an x-axis and a y-axis and rotations about a z-axis defined perpendicular to the both the x-axis and the y-axis. In one embodiment consistent with the present invention, system 1400 further comprises a baseplate 1450 for supporting the patterning device. The baseplate 1450 may be mated to the gripper 1430 with the kinematic mount.

In one embodiment consistent with the present invention, the reticle stage 1410 of system 1400 moves in only a second three degrees of freedom different than the first three degrees of freedom. In one embodiment, the second three degrees of freedom include translations along a z-axis and rotations about an x-axis and about a y-axis. In one embodiment, system 1400 further comprises a servo-actuator 1460 to control motion of the reticle stage 1410.

Although specific references are made in this text to the use of lithographic apparatus 100 in the manufacture of ICs, it should be understood that the lithographic apparatus 100 described herein may have other applications, such as the manufacture of integrated optical systems, guidance and detection patterns for magnetic domain memories, flat-panel displays, liquid-crystal displays (LCDs), thin film magnetic heads, etc.

Although specific reference are made to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of substantially 5-20 nm), as well as particle beams, such as ion beams or electron beams.

While specific embodiments of the invention have been described, it will be appreciated that the invention may be practiced otherwise than as described. For example, at least a part of the invention may take the form of a computer program containing one or more sequences of machine-readable instructions describing a method as disclosed, or a data storage medium (e.g., semiconductor memory, magnetic or optical disk) having such a computer program stored therein.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method to load a patterning device onto a reticle stage of a lithography system, the method comprising:
   aligning a Rapid Exchange Device (RED) with the reticle stage, the RED having the patterning device positioned thereon and allowing compliant movement of the patterning device in a first three degrees of freedom;
   moving the reticle stage to initiate contact with the patterning device;
   monitoring a contact force between the reticle stage and patterning device;
   controlling the reticle stage to allow compliant movement in a second three degrees of freedom until the reticle stage and patterning device are substantially in contact and coplanar based on the monitoring;
   wherein the first three degrees of freedom and the second three degrees of freedom are selected from the group consisting of translations along an x-axis; translations along a y-axis, which is perpendicular to the x-axis; translations along a z-axis, is perpendicular to the both the x-axis and the y-axis: rotations about the x-axis; rotations about the y-axis; and rotations about the z-axis; and
   wherein the first and second three degrees of freedom are all different.

2. The method of claim 1, further comprising:
   activating a clamp to secure the patterning device to the reticle stage when the monitor ed force reaches a preset threshold.

3. The method of claim 1, wherein:
   the first three degrees of freedom includes translations along an x-axis, translations along a y-axis, which is perpendicular to the x-axis, and rotations about a z-axis, which is perpendicular to the both the x-axis and the y-axis.

4. The method of claim 3, further comprising:
   positioning the patterning device on the RED with a kinematic mount comprising compliant pins;
   wherein the kinematic mount allows for the first three degrees of freedom.

5. The method of claim 4, wherein:
   the compliant pins comprise pin flexures.

6. The method of claim 3, wherein:
   the second three degrees of freedom includes translations along the z-axis and rotations about the x-axis and about the y-axis.

7. The method of claim 6, further comprising:
   reducing a gain of a servo-actuator after the reticle stage and patterning device are in contact to allow for the rotations about the x-axis and about the y-axis in the second three degrees of freedom.

8. A Rapid Exchange Device (RED) configured to load a patterning device onto a reticle stage of a lithography system comprising:
   arms mounted to a shaft positioned along a central axis, the arms and shaft configured to rotate about the central axis;
   a gripper mounted to each arm; and
   a kinematic mount comprising compliant pins attached to the gripper to position a patterning device on the gripper;
   wherein each compliant pin is configured to be compliant in a first three degrees of freedom and restrict movement in a second three degrees of freedom;
   wherein the first three degrees of freedom and the second three degrees of freedom are selected from the group consisting of translations along an x-axis; translations along a y-axis, which is perpendicular to the x-axis; translations along a z-axis, which is perpendicular to the both the x-axis and the y-axis; rotations about the x-axis; rotations about the y-axis; and rotations about the z-axis; and
   wherein the first and second three degrees of freedom are all different.

9. The RED of claim 8, wherein the compliant pins comprise pin flexures.

10. The RED of claim 8, further comprising:
    a baseplate for supporting the patterning device mated to the gripper with the compliant pins.

11. The RED of claim 8, wherein the first three degrees of freedom are translations along the x-axis, translations along the y-axis, and rotations about the z-axis; and
    wherein the second three degrees of freedom are rotations about the x-axis, rotations about the y-axis, and translations along the z-axis.

12. A system for manufacturing a semiconductor device lithographically, the system comprising:
    a reticle stage; and
    a Rapid Exchange Device (RED) to load a patterning device onto the reticle stage;
    wherein the RED comprises
    arms mounted to a shaft positioned along a central axis, the arms and shaft configured to rotate about the central axis;
    a gripper mounted to each arm; and
    a kinematic mount comprising compliant pins attached to the gripper to position a patterning device on the gripper;
    wherein each compliant pin is configured to be compliant in a first three degrees of freedom and restrict movement in a second three degrees of freedom;
    wherein the first three degrees of freedom and the second three degrees of freedom are selected from the group consisting of translations along an x-axis; translations along a y-axis, which is perpendicular to the x-axis; translations along a z-axis, which is perpendicular to the both the x-axis and the y-axis; rotations about the x-axis; rotations about the y-axis; and rotations about the z-axis; and
    wherein the first and second three degrees of freedom are all different.

13. The system of claim 12, wherein the compliant pins comprises pin flexures.

14. The system of claim 12, further comprising:
a baseplate for supporting the patterning device;
wherein the baseplate is mated to the gripper at the kinematic mount.

15. The system of claim 12, wherein:
the reticle stage is configured to allow compliant movement in the second three degrees of freedom.

16. The system of claim 15, wherein the second three degrees of freedom include translations along the z-axis and rotations about the x-axis and about the y-axis.

17. The system of claim 15, further comprising:
a servo-actuator configured to control motion and compliant movement of the reticle stage.

18. The system of claim 12, wherein the first three degrees of freedom are translations along the x-axis, translations along the y-axis, and rotations about the z-axis; and
wherein the second three degrees of freedom are rotations about the x-axis, rotations about the y-axis, and translations along the z-axis.

19. The system of claim 12, wherein the system is configured to monitor a contact force between the patterning device and the reticle stage.

\* \* \* \* \*

UNITED STATES PATENT AND TRADEMARK OFFICE
CERTIFICATE OF CORRECTION

PATENT NO.        : 9,025,135 B2          Page 1 of 1
APPLICATION NO.   : 13/260017
DATED             : May 5, 2015
INVENTOR(S)       : Johnson et al.

It is certified that error appears in the above-identified patent and that said Letters Patent is hereby corrected as shown below:

In the claims,
In claim 1, column 17, line 48, after "z-axis," please insert --which--.
In claim 1, column 17, line 49, after "y-axis" please delete ":" and insert --;--.
In claim 2, column 17, line 56, please delete "monitor ed" insert --monitored--.

Signed and Sealed this
Fifth Day of January, 2016

Michelle K. Lee
*Director of the United States Patent and Trademark Office*